United States Patent
Sadovnikov et al.

(10) Patent No.: US 12,211,807 B2
(45) Date of Patent: Jan. 28, 2025

(54) SEMICONDUCTOR DOPED REGION WITH BIASED ISOLATED MEMBERS

(71) Applicant: Texas Instruments Incorporated, Dallas, TX (US)

(72) Inventors: Alexei Sadovnikov, Sunnyvale, CA (US); Sheldon Douglas Haynie, Myrtle Beach, SC (US); Ujwal Radhakrishna, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/490,866

(22) Filed: Oct. 20, 2023

(65) Prior Publication Data

US 2024/0047387 A1 Feb. 8, 2024

Related U.S. Application Data

(62) Division of application No. 17/318,556, filed on May 12, 2021, now Pat. No. 11,830,830.

(51) Int. Cl.
*H01L 23/64* (2006.01)
*H01L 29/40* (2006.01)
(Continued)

(52) U.S. Cl.
CPC .......... *H01L 23/647* (2013.01); *H01L 29/401* (2013.01); *H01L 29/404* (2013.01);
(Continued)

(58) Field of Classification Search
CPC ................. H01L 29/404; H01L 29/407; H01L 29/66681; H01L 29/7816; H01L 29/7835; H01L 29/66659; H01L 29/647
See application file for complete search history.

(56) References Cited

U.S. PATENT DOCUMENTS

| 4,290,077 A | 9/1981 | Ronen |
| 5,106,776 A | 4/1992 | Shen et al. |

(Continued)

FOREIGN PATENT DOCUMENTS

| CN | 110518056 A | 11/2019 | |
| CN | 111816707 A | * 10/2020 | ........... H01L 29/404 |

(Continued)

OTHER PUBLICATIONS

Zhang, "Experiments of a Novel low on-resistance LDMOS with 3-D Floating Vertical Field Plate", Proceedings of the 31st International Symposium on Power Semiconductor Devices & ICs, pp. 507-510, May 19-23, 2019, Shanghai, China.

(Continued)

*Primary Examiner* — Joseph C. Nicely
(74) *Attorney, Agent, or Firm* — Yudong Kim; Frank D. Cimino

(57) ABSTRACT

A microelectronic device includes a doped region of semiconductor material having a first region and an opposite second region. The microelectronic device is configured to provide a first operational potential at the first region and to provide a second operational potential at the second region. The microelectronic device includes field plate segments in trenches extending into the doped region. Each field plate segment is separated from the semiconductor material by a trench liner of dielectric material. The microelectronic device further includes circuitry electrically connected to each of the field plate segments. The circuitry is configured to apply bias potentials to the field plate segments. The bias potentials are monotonic with respect to distances of the field plate segments from the first region of the doped region.

19 Claims, 29 Drawing Sheets

(51) Int. Cl.
*H01L 29/66* (2006.01)
*H01L 29/78* (2006.01)

(52) U.S. Cl.
CPC ...... *H01L 29/407* (2013.01); *H01L 29/66659* (2013.01); *H01L 29/66681* (2013.01); *H01L 29/7816* (2013.01); *H01L 29/7835* (2013.01); *H01L 2223/6672* (2013.01)

(56) References Cited

U.S. PATENT DOCUMENTS

| | | | |
|---|---|---|---|
| 11,424,331 B1 * | 8/2022 | Qiao | H01L 29/404 |
| 2003/0071320 A1 | 4/2003 | Kocon | |
| 2010/0264486 A1 * | 10/2010 | Denison | H01L 29/66734 |
| | | | 438/270 |
| 2017/0263765 A1 | 9/2017 | Kosier et al. | |
| 2021/0083097 A1 * | 3/2021 | Gangi | H01L 29/0696 |
| 2021/0399086 A1 * | 12/2021 | Chi | H01L 29/0649 |
| 2022/0037468 A1 * | 2/2022 | Haynie | H01L 29/063 |

FOREIGN PATENT DOCUMENTS

| | | | | |
|---|---|---|---|---|
| DE | 102006055742 A1 * | 6/2008 | ........... | H01L 29/404 |
| DE | 102006055742 B4 * | 7/2011 | ........... | H01L 29/404 |

OTHER PUBLICATIONS

Fan, "A novel structure of SOI lateral MOSFET with vertical field plate", 2015 International Conference on Optoelectronics and Microelectronics (ICOM), pp. 360-364, Jul. 16-18, 2015.

* cited by examiner

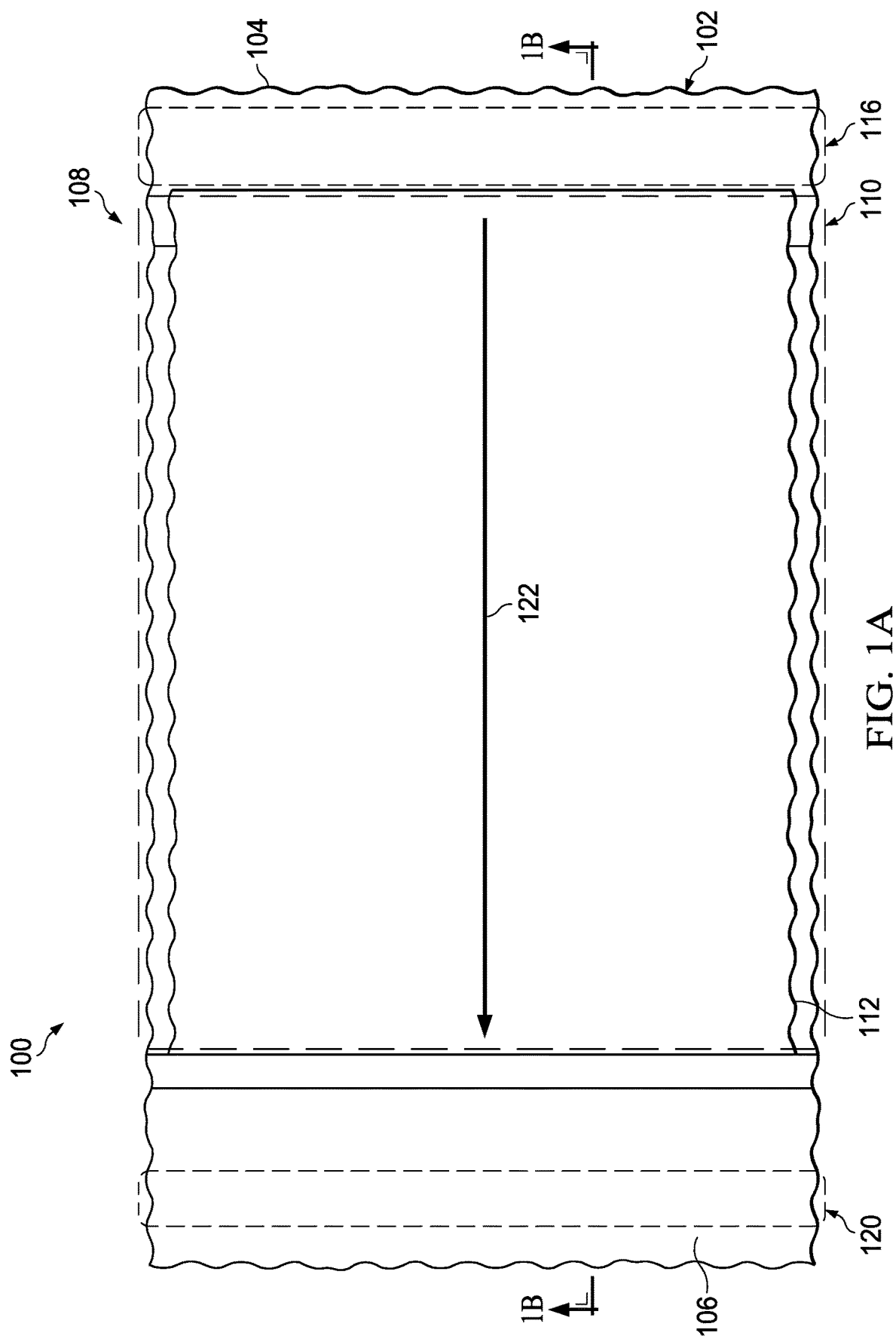

SEMICONDUCTOR DOPED REGION WITH BIASED ISOLATED MEMBERS

CROSS REFERENCE TO RELATED APPLICATION

This application is a Division of U.S. Nonprovisional patent application Ser. No. 17/318,556 filed May 12, 2021, which is hereby incorporated by reference in its entirety herein.

FIELD

This disclosure relates to the field of microelectronic devices. More particularly, but not exclusively, this disclosure relates to doped regions in microelectronic devices.

BACKGROUND

A microelectronic device may include a doped region that is under bias in an off state, that is, with only leakage current flowing through the doped region. The doped region may conduct current in an on state. It may be desirable to minimize an area of the doped region while attaining a specified ohmic resistance in the on state and attaining a specific operational bias in the off state.

SUMMARY

The present disclosure introduces a microelectronic device including a doped region of semiconductor material. The microelectronic device is configured to provide a first operational potential at a first region of the semiconductor material and to provide a second operational potential, different from the first operational potential, at a second region, during operation of the microelectronic device. The doped region is between the first region and the second region. The microelectronic device includes field plate segments in trenches extending into the doped region. Each field plate segment is separated from the semiconductor material by a trench liner of dielectric material. The field plate segments include a first field plate segment nearest the first region, a second field plate segment nearest the second region, and a third field plate segment between the first field plate segment and the second field plate segment. The microelectronic device further includes circuitry electrically connected to each of the field plate segments. The circuitry is configured to apply a first bias potential to the first field plate segment, apply a second bias potential to the second field plate segment, and apply a third bias potential to the third field plate segment. The first bias potential, the second bias potential, and the third bias potential are all between the first operational potential and the second operational potential. The third bias potential is between the first bias potential and the second bias potential.

BRIEF DESCRIPTION OF THE VIEWS OF THE DRAWINGS

FIG. 1A through FIG. 1L are alternating top views and cross sections of an example microelectronic device having a doped region, depicted in stages of an example method of formation.

DETAILED DESCRIPTION

Figure 1B:
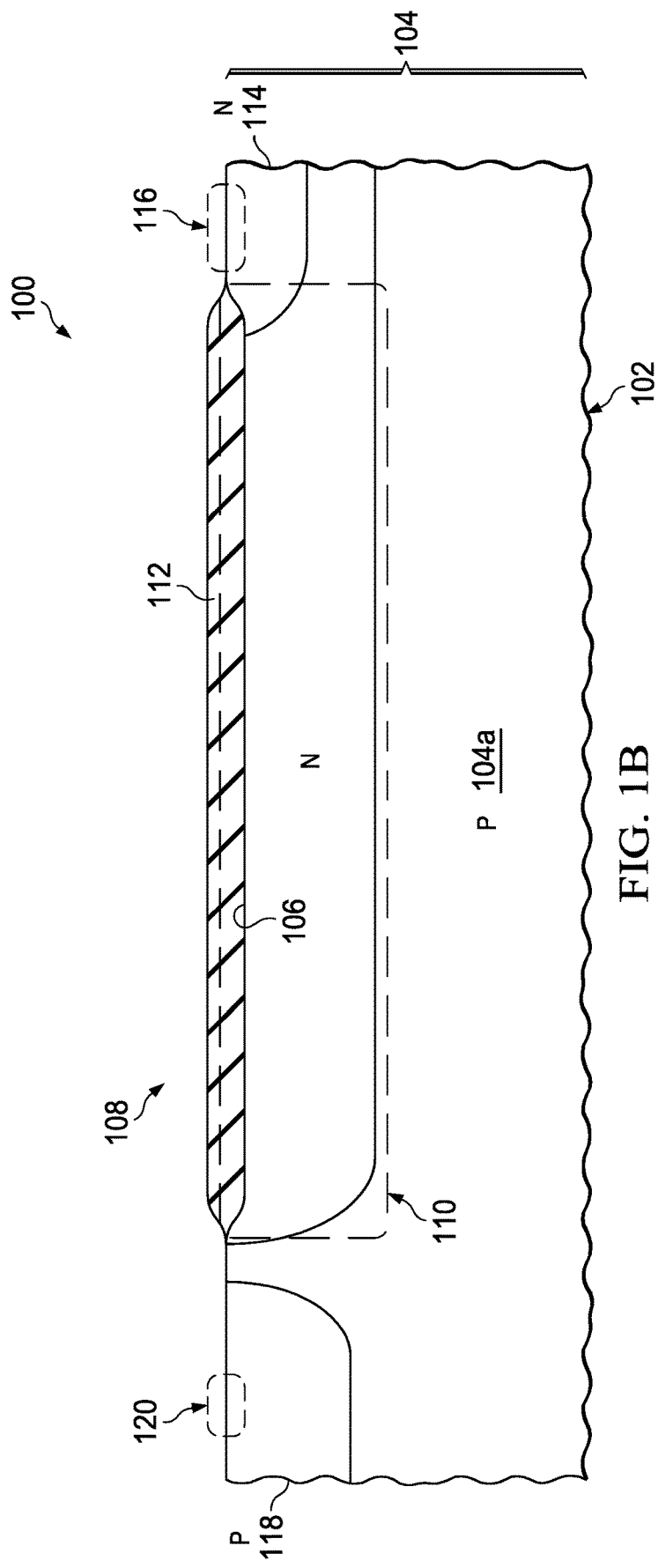

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a substrate having a semiconductor material extending to a top surface of the substrate. The microelectronic device includes an active component having a doped region in the semiconductor material. The active component may be manifested as a metal oxide semiconductor (MOS) transistor, a junction field effect transistor (JFET), a bipolar junction transistor, an insulated gate bipolar transistor (IGBT), a bipolar junction diode, and a Schottky diode, by way of example. The microelectronic device is configured to provide a first operational potential at a first region of the semiconductor material and to provide a second operational potential at a second region of the semiconductor material, during operation of the microelectronic device. The doped region is between the first region and the second region. The first region and the second region are approximately perpendicular to current flow through the doped region during operation of the microelectronic device. The first operational potential is generally different from the second operational potential. During operation of the microelectronic device, the first operational potential changes as the active component is switched from an on state to an off state, and vice versa. Current flows through the doped region parallel to a current flow direction, from the first region to the second region, or vice versa, during operation of the microelectronic device.

The microelectronic device includes field plate segments in trenches extending into the doped region from the top surface of the substrate. Each field plate segment is separated from the semiconductor material by a trench liner of dielectric material. The field plate segments include at least a first field plate segment nearest the first region of the doped region, a second field plate segment nearest the second region of the doped region, and a third field plate segment between the first field plate segment and the second field plate segment. The field plate segments may be arranged in rows and columns in the doped region, the rows being perpendicular to the current flow direction and the columns being parallel to the current flow direction.

The microelectronic device further includes circuitry electrically connected to each of the field plate segments. The circuit is configured to apply bias potentials to the field plate segments. All the bias potentials are between the first operational potential and the second operational potential. The bias potentials are monotonic with respect to distances of the field plate segments from the first region of the doped region. That is, the first field plate segment, being closer to the first region than the third field plate segment, will have a bias potential closer to the first operational potential, and thus further from the second operational potential, than the third field plate segment. The second field plate segment, being further from the first region than the third field plate segment, will have a bias potential further from the first operational potential, and thus closer to the second operational potential, than the third field plate segment.

The circuitry is configured to adjust the bias potentials to track changes in the first operational potential, as the active component is switched from the off state to the on state, and back to the off state. Applying the bias potentials as disclosed may reduce an electric field in the doped region, which may advantageously enable the active component to operate at a higher value of the first operational potential, with respect to the second operational potential, in an off state, than a similar active component without the field plate segments. Furthermore, applying the bias potentials as disclosed may enable the doped region to have a higher dopant concentration than the similar active component without the field plate segments, in an on state, advantageously reducing an ohmic resistance of the doped region compared to the similar active component.

In the off state, a magnitude of the difference between the first operational potential and the second operational potential may be more than 10 times the magnitude of the difference between the first operational potential and the second operational potential in the on state. Having the bias potentials track the changes in the first operational potential and the second operational potential, as the active component is switched, may maintain a maximum potential difference across the trench liners to less than 5 percent of a maximum difference between the first operational potential and the second operational potential, which enable thinner trench liners compared to similar active components without the circuitry. The thinner trench liners in turn enable more complete charge balance to be attained in the off state, and thus higher operating potentials for the active component.

It is noted that terms such as top, bottom, over, under, and below may be used in this disclosure. These terms should not be construed as limiting the position or orientation of a structure or element, but should be used to provide spatial relationship between structures or elements. For the purposes of this disclosure, the term "lateral" refers to directions parallel to a plane of the top surface of the substrate. The term "vertical" refers to a direction perpendicular to the plane of the top surface of the substrate. For the purposes of this disclosure, it will be understood that, if an element is referred to as being "directly coupled" or "directly connected" to another element, it is understood there are no other intentionally disposed intervening elements present.

It is to be noted that in the text as well as in all of the Figures, the respective structures will be termed the "microelectronic device" and labeled with corresponding reference numbers, even though the device is not yet completed until some of the last stages of manufacturing described herein. This is done primarily for the convenience of the reader.

FIG. 1A through FIG. 1L are alternating top views and cross sections of an example microelectronic device having a doped region, depicted in stages of an example method of formation. Referring to FIG. 1A and FIG. 1B, the microelectronic device 100 is formed in and on a substrate 102. The substrate 102 may be, for example, part of a bulk semiconductor wafer, part of a semiconductor wafer with an epitaxial layer, part of a silicon-on-insulator (SOI) wafer, or other structure suitable for forming the microelectronic device 100. The substrate 102 may include other microelectronic devices, not shown. The substrate 102 includes a semiconductor material 104 which extends to a top surface 106 of the substrate 102. In this example, the semiconductor material 104 may be p-type to start with.

The microelectronic device 100 includes an active component 108. In this example, the active component 108 may be manifested as an n-channel extended drain MOS transistor 108, and will be referred to as the MOS transistor 108 in the disclosure of this example. A doped region 110 is formed in the semiconductor material 104, leaving a p-type portion 104a of the semiconductor material 104 under the doped region 110. The doped region 110 of this example is n-type, and may be formed by implanting n-type dopants, such as phosphorus, into the semiconductor material 104, followed by annealing the substrate 102 to diffuse and activate the n-type dopants. The doped region 110 may have an average dopant concentration of the n-type dopants of $1 \times 10^{16}$ cm$^{-2}$ to $1 \times 10^{17}$ cm$^{-2}$, by way of example. The doped region 110 may be part of an n-type well in the semiconductor material 104. The doped region 110 of this example may provide a drift region of the MOS transistor 108.

A dielectric layer 112 is formed on the substrate 102, at the top surface 106. The dielectric layer 112 of this example extends over the doped region 110. The dielectric layer 112 may be implemented as field oxide 112, with a thickness of 200 nanometers to 400 nanometers. In one version of this example, the dielectric layer 112 may be formed by a local oxidation of silicon (LOCOS) process, which includes forming a layer of thermal oxide at the top surface 106, and forming a patterned layer of silicon nitride on the thermal oxide. The dielectric layer 112 is formed by thermal oxidation in areas exposed by the patterned layer of silicon nitride. The patterned layer of silicon nitride is subsequently removed. The dielectric layer 112 formed by the LOCOS process has tapered edges, as depicted in FIG. 1B, referred to as bird's beaks. In another version of this example, the dielectric layer 112 may be formed by a shallow trench isolation (STI) process. Alternatively, the dielectric layer 112 may be implemented as a field plate isolation layer, with a thickness of 100 nanometers to 250 nanometers. The dielectric layer 112 implemented as the field plate isolation layer may be formed by forming a layer of thermal oxide at the top surface 106, and forming a layer of silicon dioxide by a low pressure chemical vapor deposition (LPCVD) process using dichlorosilane and oxygen on the thermal oxide. The layer of silicon dioxide is subsequently patterned by etching to provide the dielectric layer 112. Other methods of forming the dielectric layer 112 are within the scope of this example.

A drain well 114 of the MOS transistor 108 is formed in the semiconductor material 104 at a first region 116 of the semiconductor material 104. The drain well 114 of this example is n-type, and has a higher average concentration of n-type dopants than the doped region 110. The term "well" as used in this disclosure is intended to mean either an n-type well or a p-type well, and includes the case in which the well that has the same conductivity type as the semiconductor material surrounding the well. N-type dopants in the drain well 114 may include phosphorus and arsenic, for example. The drain well 114 may be formed by implanting the n-type dopants into the semiconductor material 104, and subsequently annealing the substrate 102 to activate and diffuse the n-type dopants.

A body region 118 of the MOS transistor 108 is formed in the semiconductor material 104 proximate to a second region 120 of the semiconductor material 104. The doped region 110 is between the first region 116 and the second region 120. The body region 118 of this example is p-type, and may have an average concentration of p-type dopants, such as boron, of $1 \times 10^{17}$ cm$^{-2}$ to $1 \times 10^{18}$ cm$^{-2}$, by way of example. The body region 118 may be formed by implanting the p-type dopants into the semiconductor material 104, and subsequently annealing the substrate 102 to activate and diffuse the p-type dopants. In one version of this example, the n-type dopants may be implanted into the semiconductor material 104 for the drain well 114 and the p-type dopants may be implanted into the semiconductor material 104 for the body region 118, and the substrate 102 may be subsequently annealed to concurrently activate and diffuse the p-type dopants in the body region 118 and the n-type dopants in the drain well 114.

During operation of the MOS transistor 108, current may flow from the first region 116 to the second region 120. The current flows parallel to a current flow direction 122 which extends from the first region 116 to the second region 120.

Figure 1C:
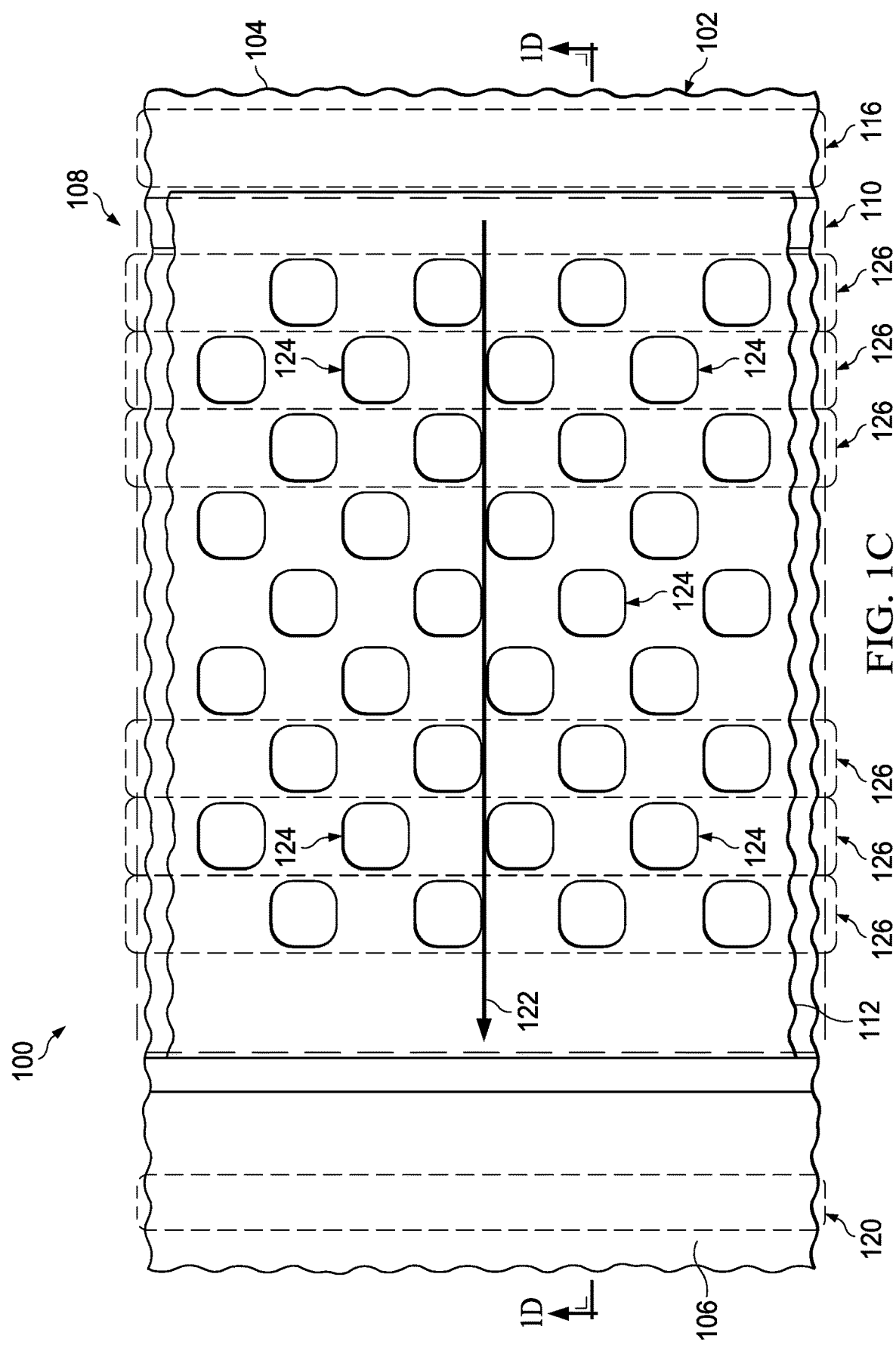
Figure 1D:
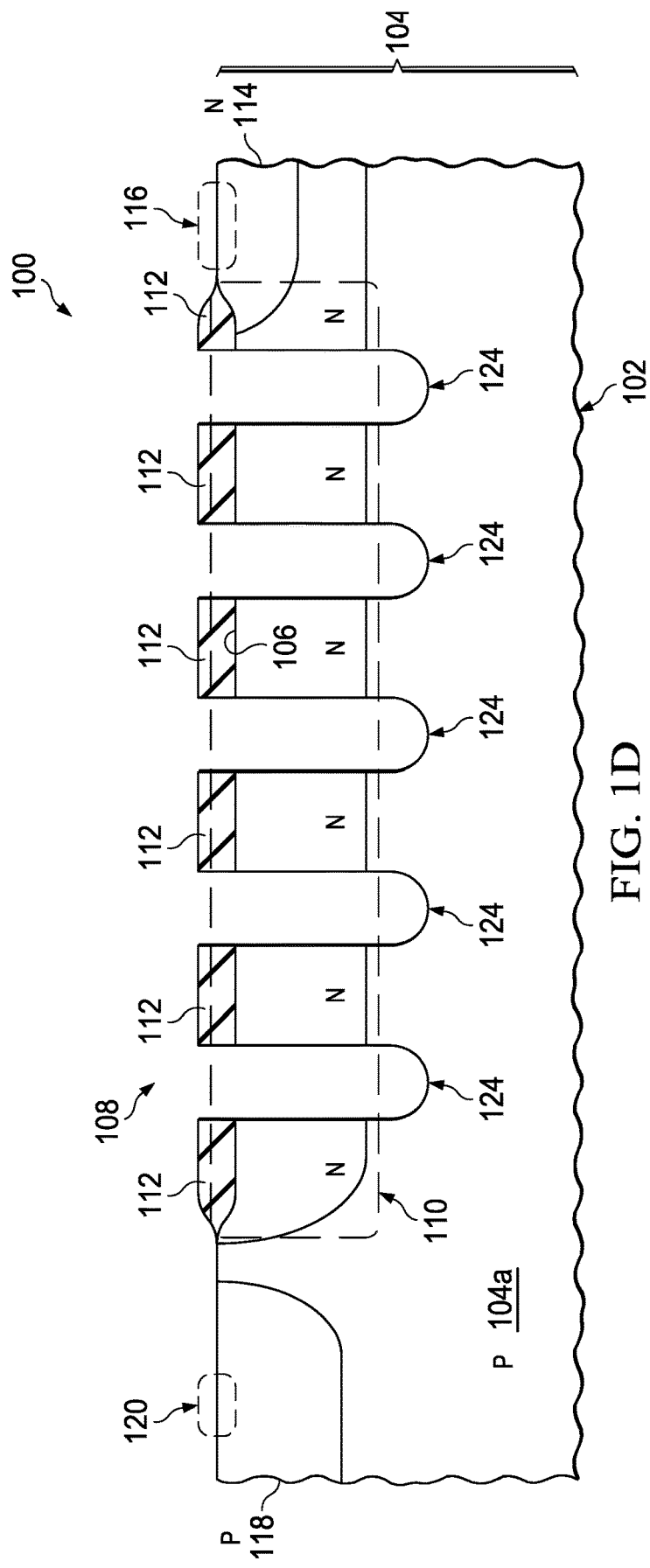

Referring to FIG. 1C and FIG. 1D, trenches 124 are formed through the dielectric layer 112 and in the semiconductor material 104 from the top surface 106, extending into the doped region 110. In this example, the trenches 124 may extend through the doped region 110 into the p-type portion 104a of the semiconductor material 104 under the doped region 110, as depicted in FIG. 1D. The trenches 124 may have lateral dimensions of 1 micron to 10 microns, by way of example.

The trenches 124 of this example may be arranged in seriate alternating rows 126. Each row 126 is perpendicular to the current flow direction 122, as depicted in FIG. 1C. Instances of the trenches 124 in a same row 126 are equidistant from the first region 116 of the semiconductor material 104, within fabrication tolerances encountered in forming the microelectronic device 100. Other arrangements of the trenches 124 are within the scope of this example.

The trenches 124 may be formed by etching, such as by a reactive ion etch (RIE) process. A hard mask, not shown, of silicon nitride or sublayers of silicon nitride and silicon dioxide may be formed over the dielectric layer 112, exposing areas for the trenches 124, and the RIE process may then remove material from the dielectric layer 112 and the semiconductor material 104 to form the trenches 124. The hard mask may subsequently be removed. Other methods of forming the trenches 124 are within the scope of this example. The trenches 124 may have equal lateral dimensions, with rounded rectangular shapes, as depicted in FIG. 1C. Other shapes for the trenches 124 are within the scope of this example.

Figure 1E:
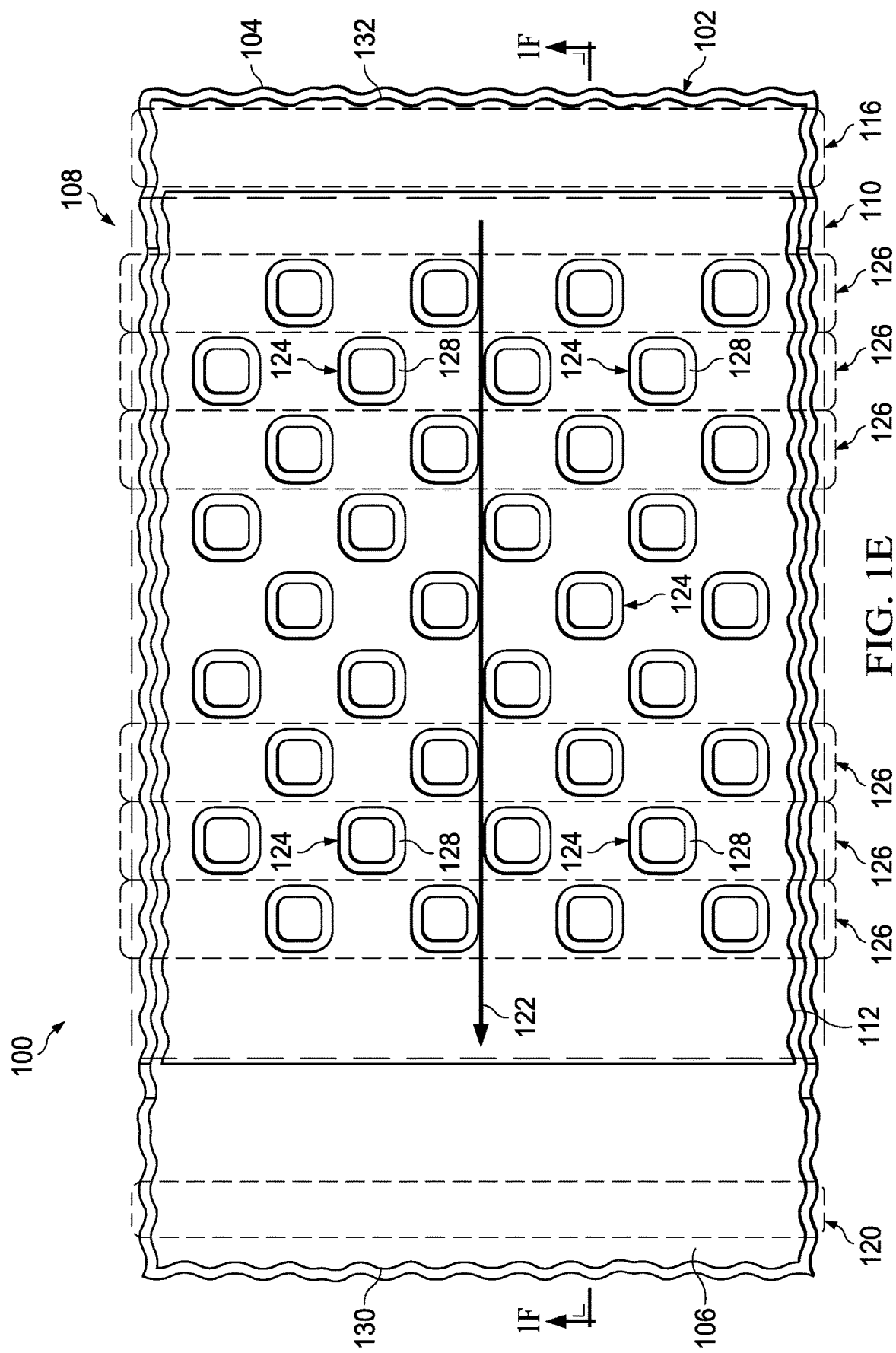
Figure 1F:
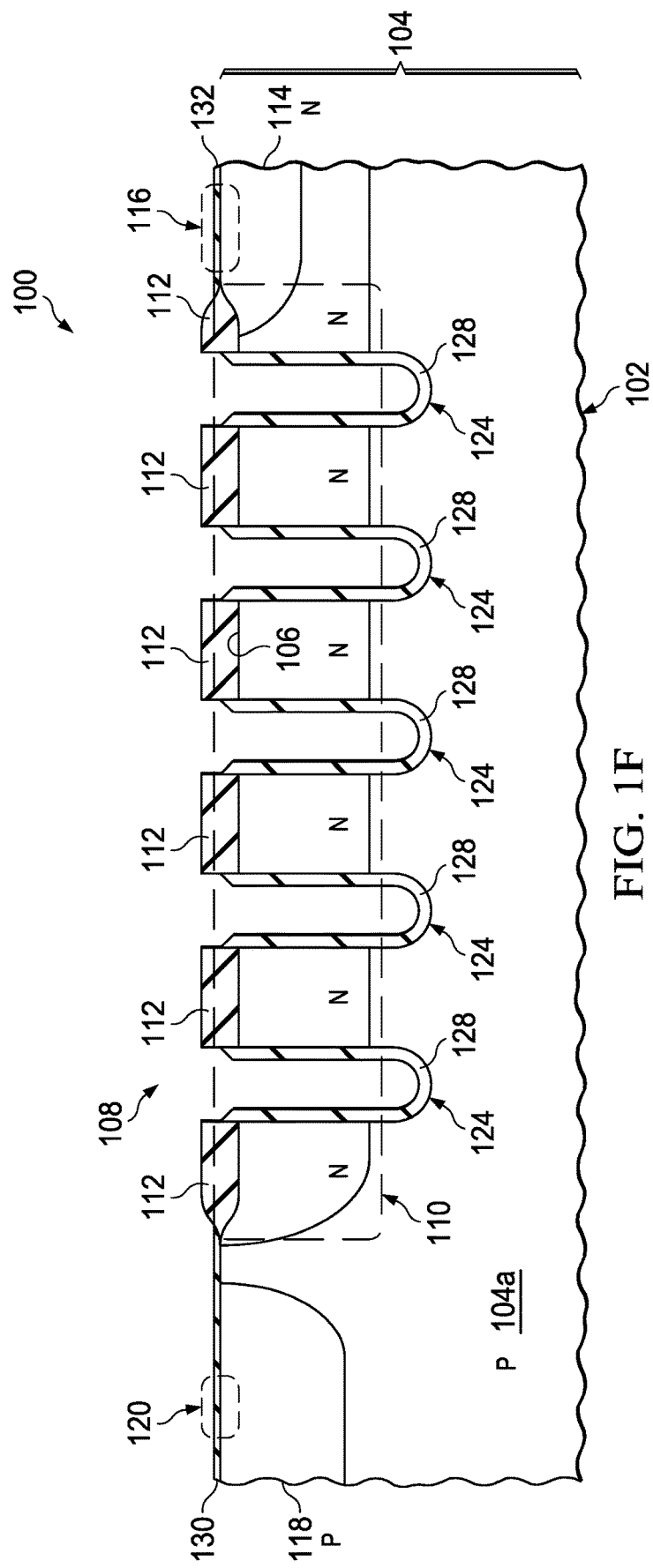

Referring to FIG. 1E and FIG. 1F, trench liners 128 are formed in the trenches 124, contacting the semiconductor material 104. The trench liners 128 may include primarily silicon dioxide formed by thermal oxidation of silicon, referred to as thermal oxide, in the semiconductor material 104 abutting the trenches 124. Thermal oxide may be characterized by having a stoichiometry of $SiO_2$ with less than 0.1 atomic percent of hydrogen. Thermal oxide may advantageously provide a higher dielectric strength and uniform thickness in the trenches 124 compared to other materials for the trench liners 128. The trench liners 128 may have a thickness of 5 nanometers to 50 nanometers, which may advantageously enable more complete charge balance in the doped region 110 during operation of the MOS transistor 108 compared to thicker trench liners 128.

In this example, a gate dielectric layer 130 of the MOS transistor 108 may be formed concurrently with the trench liners 128. The gate dielectric layer 130 is formed at the top surface 106, extending to the dielectric layer 112, over the body region 118 and over the doped region 110 exposed by the dielectric layer 112 at the second region 120 of the semiconductor material 104. A layer of pad oxide 132 may be concurrently formed at the top surface 106, over the drain well 114 and the first region 116. Forming the gate dielectric layer 130 concurrently with the trench liners 128 may advantageously reduce fabrication cost and complexity of the microelectronic device 100.

Figure 1G:
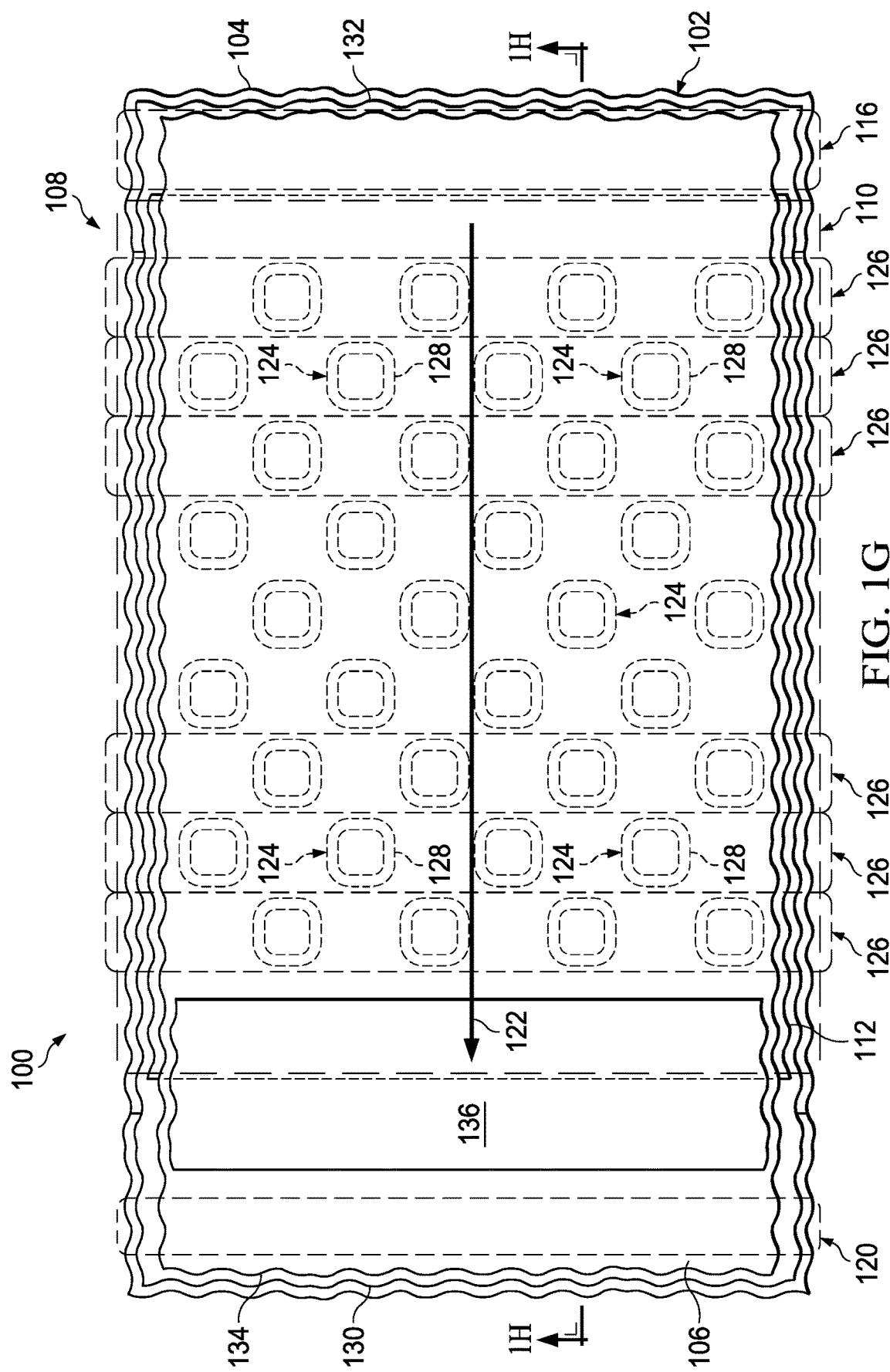
Figure 1H:
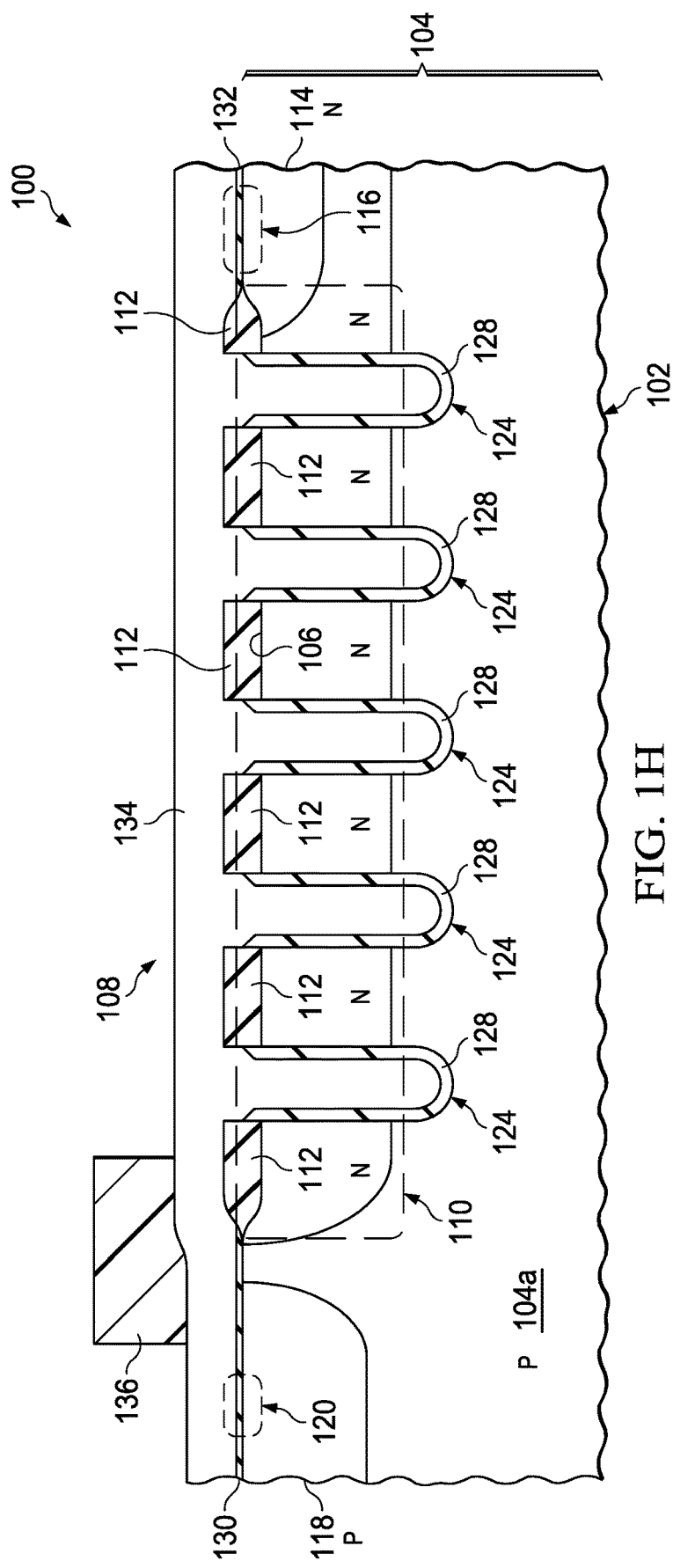

Referring to FIG. 1G and FIG. 1H, a conductive layer 134 is formed over the microelectronic device 100, on the trench liners 128, the dielectric layer 112, and the gate dielectric layer 130. The conductive layer 134 may include polycrystalline silicon, commonly referred to as polysilicon, and may include n-type dopants such as phosphorus or arsenic. The conductive layer 134 may be formed by thermal decomposition of silane or disilane, by way of example. In alternate versions of this example, the conductive layer 134 may include another electrically conductive material, such as titanium nitride or tantalum nitride.

Figure 1I:
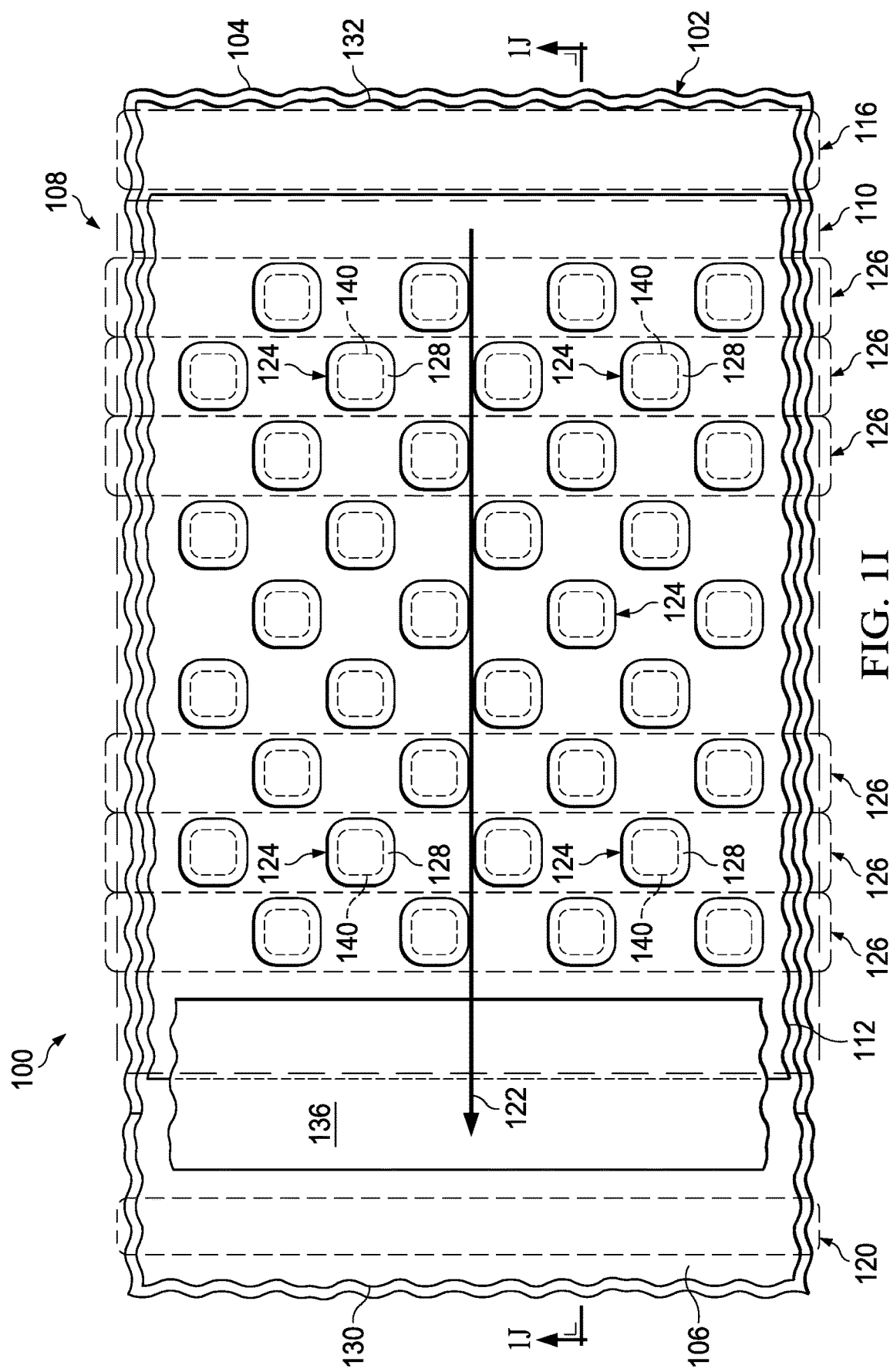
Figure 1J:
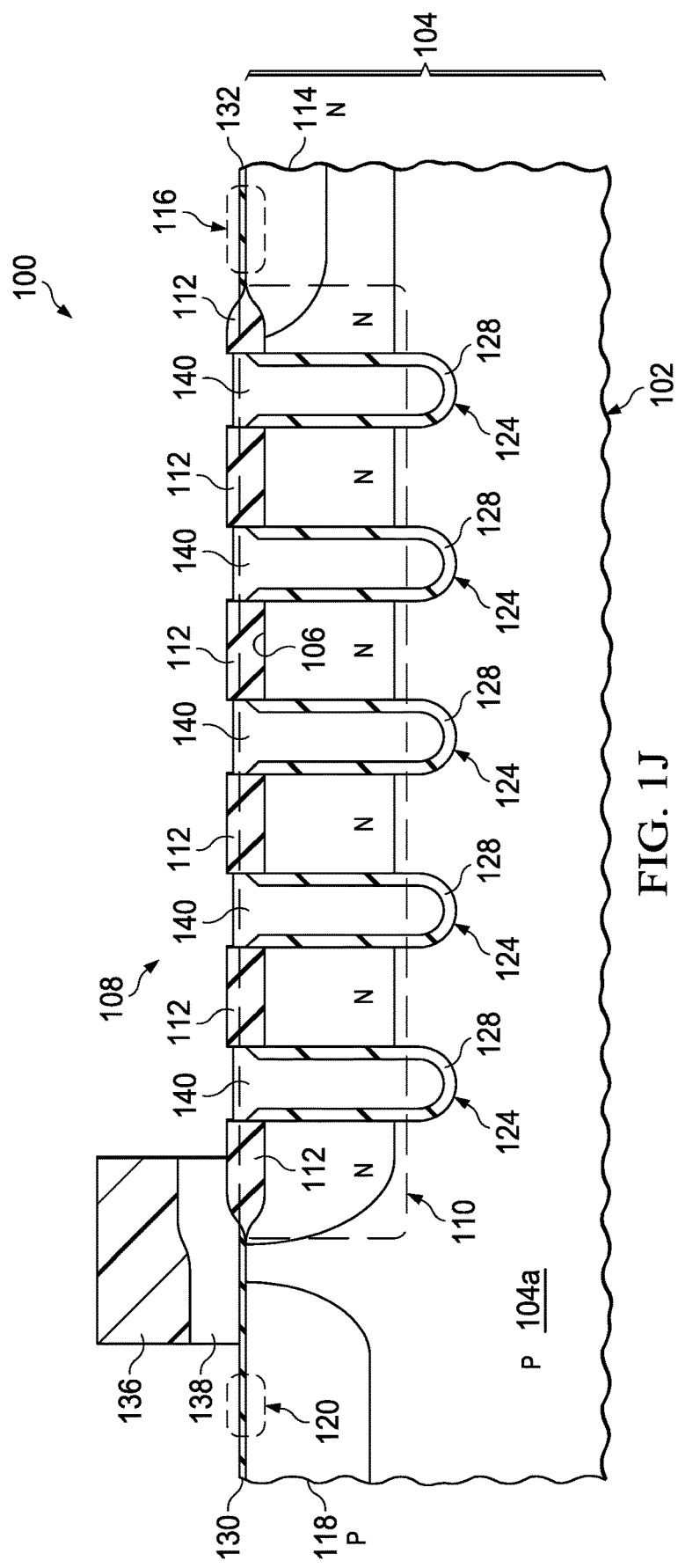

A gate mask 136 is formed over the conductive layer 134, on an area for a gate 138, shown in FIG. 1I and FIG. 1J, of the MOS transistor 108. The area for the gate 138 extends partway over the body region 118, partway over the doped region 110, and partway onto the dielectric layer 112. The gate mask 136 may include photoresist, formed by a photolithographic process, and organic anti-reflection material, or may include hard mask material such as silicon dioxide or silicon nitride, and inorganic anti-reflection material. In an alternate version of this example, the gate mask 136 may extend over the dielectric layer 112 partway to the first region 116, with openings for the trenches 124.

Referring to FIG. 1I and FIG. 1J, a portion of the conductive layer 134 of FIG. 1G and FIG. 1H is removed by an etch process, leaving the conductive layer 134 under the gate mask 136 to form the gate 138 of the MOS transistor 108. The gate 138 extends partway over the body region 118 proximate to the second region 120 of the semiconductor material 104 and partway over the doped region 110 exposed by the dielectric layer 112, and partway onto the dielectric layer 112. The conductive layer 134 is left in the trenches 124 to form field plate segments 140 on the trench liners 128. The field plate segments 140 are separated from the semiconductor material 104 by the trench liners 128. In versions of this example in which the gate mask 136 extends over the dielectric layer 112 partway to the first region 116, the conductive layer 134 is left over the doped region 110, between the trenches 124, to provide a horizontal field plate, not shown.

The etch process to remove the portion of the conductive layer 134 may include an RIE step, for example. After the etch process is completed, the gate mask 136 is removed. Organic material in the gate mask 136 may be removed by oxygen radicals in an asher process, followed by a wet clean process using an aqueous mixture of sulfuric acid and hydrogen peroxide. Inorganic material in the gate mask 136 may be removed by a plasma etch using fluorine that has selectivity with respect to the gate 138. Forming the gate 138 concurrently with the field plate segments 140 may further advantageously reduce fabrication cost and complexity of the microelectronic device 100.

Figure 1K:
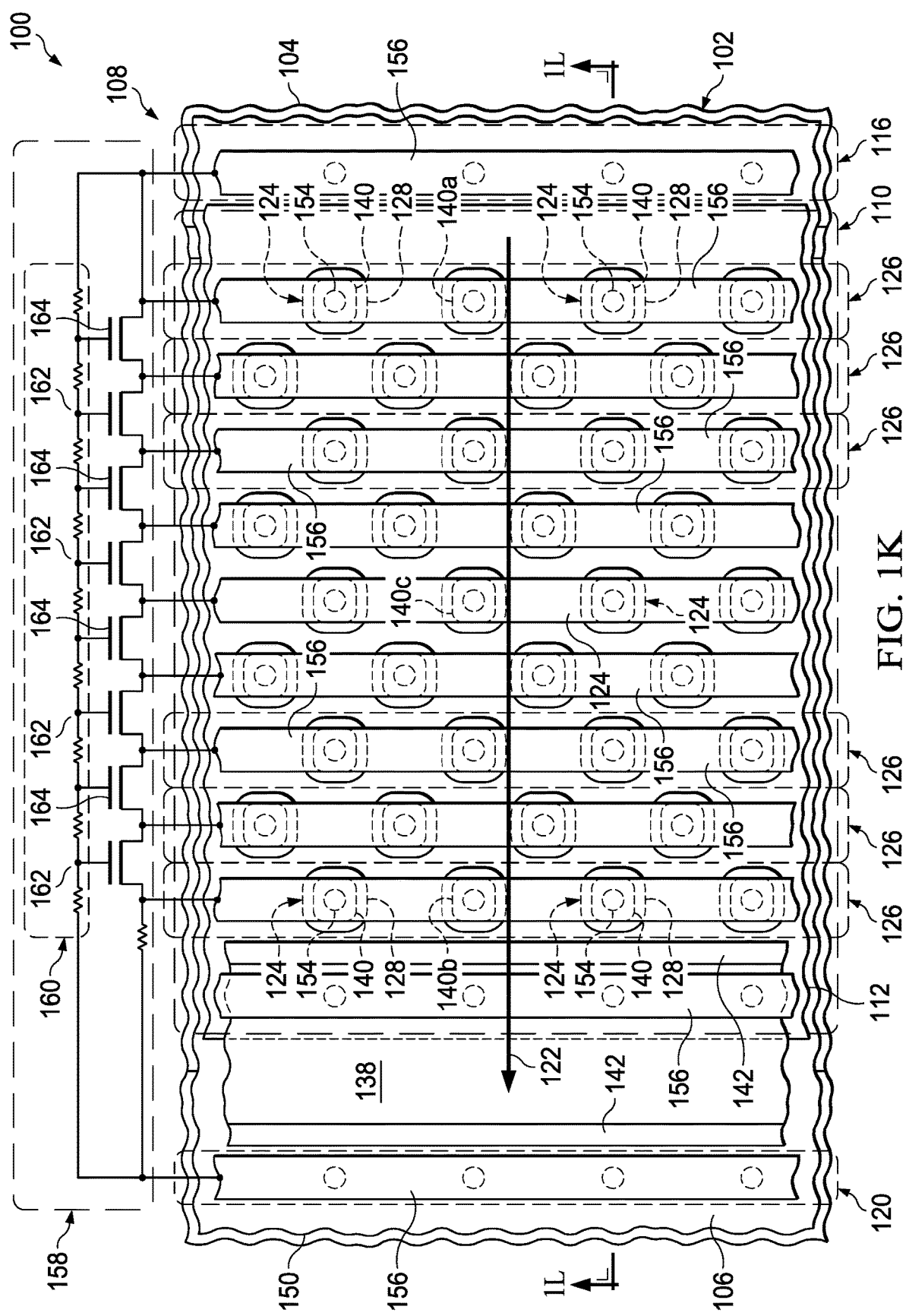
Figure 1L:
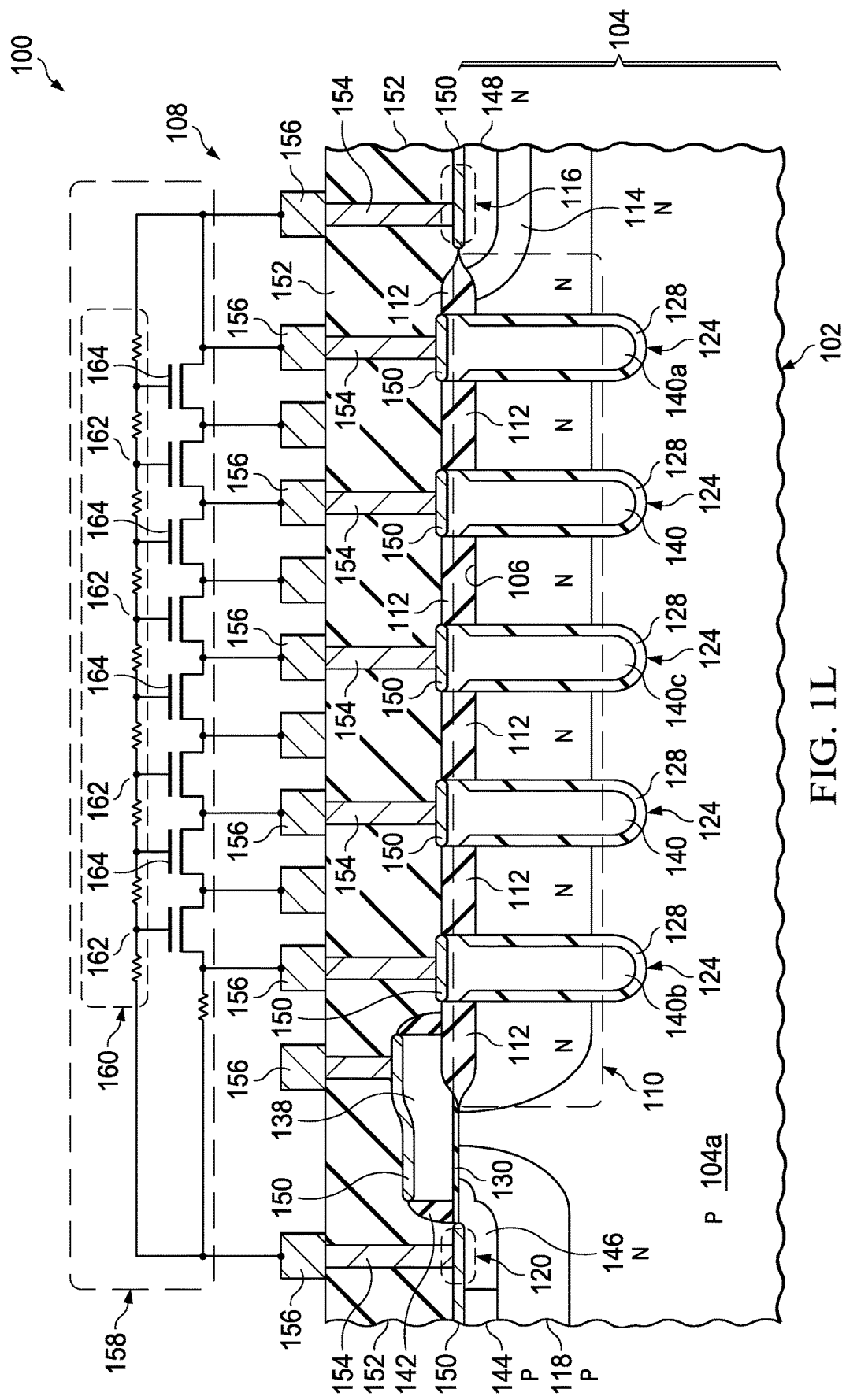

Referring to FIG. 1K and FIG. 1L, sidewall spacers 142 may be formed on vertical surfaces of the gate 138. The sidewall spacers 142 may include one or more layers of silicon dioxide and silicon nitride, formed by one or more LPCVD or plasma enhanced chemical vapor deposition (PECVD) processes, followed by an anisotropic plasma etch to remove the layers of silicon dioxide and silicon nitride from horizontal surfaces of the microelectronic device 100.

A body contact region 144 of the MOS transistor 108 is formed in the semiconductor material 104, contacting the body region 118. The body contact region 144 is p-type, and has a higher average concentration of p-type dopants than the body region 118. The body contact region 144 may be formed by implanting p-type dopants into the semiconductor material 104, or diffusing p-type dopants into the semiconductor material 104 from a solid source, such as a doped oxide, by way of example.

A source region 146 of the MOS transistor 108 is formed in the semiconductor material 104 at the second region 120, adjacent to the gate 138 and extending partway under the gate 138, contacting the body region 118. A drain contact region 148 of the MOS transistor 108 is formed in the semiconductor material 104 at the first region 116, contacting the drain well 114. The source region 146 and the drain contact region 148 are n-type, and each has a higher average concentration of n-type dopants than the drain well 114. The source region 146 and the drain contact region 148 may be formed concurrently by implanting or diffusing n-type dopants into the semiconductor material 104.

Metal silicide 150 is formed on exposed silicon, including polysilicon, on the microelectronic device 100, including on the gate 138, the body contact region 144, the source region 146, the drain contact region 148, and the field plate segments 140. The metal silicide 150 may include titanium silicide, cobalt silicide, or nickel silicide, by way of example. The metal silicide 150 may be formed by forming a layer of metal on the microelectronic device 100, contacting the exposed silicon. Subsequently, the microelectronic device 100 is heated to react the layer of metal with the exposed silicon to form the metal silicide 150. Unreacted metal is removed from the microelectronic device 100, leaving the metal silicide 150 in place. The unreacted metal may be removed by a wet etch process using an aqueous mixture of sulfuric acid and hydrogen peroxide, or an aqueous mixture of nitric acid and hydrochloric acid, by way of example. The metal silicide 150 may provide electrical connections to the gate 138, the body contact region 144, the source region 146, the drain contact region 148, and the field plate segments 140 with lower resistance compared to a similar microelectronic device without metal silicide.

A pre-metal dielectric (PMD) layer 152 of the microelectronic device 100 is formed over the substrate 102, the dielectric layer 112 and the metal silicide 150. The PMD layer 152 is electrically non-conductive, and may include one or more sublayers of dielectric material. By way of example, the PMD layer 152 may include a PMD liner, not shown, of silicon nitride, formed by an LPCVD process or a PECVD process, contacting the substrate 102, the dielectric layer 112 and the metal silicide 150. The PMD layer 152 may also include a planarized layer, not shown, of silicon dioxide, phosphosilicate glass (PSG), or borophosphosilicate glass (BPSG), formed by a PECVD process using tetraethyl orthosilicate (TEOS), formally named tetraethoxysilane, a high density plasma (HDP) process, or a high aspect ratio process (HARP) using TEOS and ozone, on the PMD liner. The PMD layer 152 may further include a PMD cap layer, not shown, of silicon nitride, silicon carbide, or silicon carbonitride, suitable for an etch-stop layer of a chemical-mechanical polish (CMP) stop layer, formed by a PECVD process using TEOS and bis(tertiary-butyl-amino) silane (BTBAS), on the planarized layer. Other layer structures and compositions for the PMD layer 152 are within the scope of this example. The PMD layer 152 is not shown in FIG. 1K, to depict the remaining elements of the microelectronic device 100 more clearly.

Contacts 154 are formed through the PMD layer 152, making electrical connections to the metal silicide 150 on the gate 138, the body contact region 144, the source region 146, the drain contact region 148, and the field plate segments 140. Each of the field plate segments 140 is electrically coupled through the metal silicide 150 to at least one corresponding contact 154. The contacts 154 are electrically conductive, and may include a contact liner, not shown, of titanium and titanium nitride contacting the PMD layer 152 and the metal silicide 150, with a tungsten core, not shown, on the liner. The contacts 154 may be formed by etching contact holes through the PMD layer 152 to expose the metal silicide 150. The contact liner may be formed by sputtering titanium followed by forming titanium nitride using an atomic layer deposition (ALD) process. The tungsten core may be formed by a metalorganic chemical vapor deposition (MOCVD) process using tungsten hexafluoride ($WF_6$) reduced by silane initially and hydrogen after a layer of tungsten is formed on the contact liner. The tungsten, titanium nitride, and titanium is subsequently removed from a top surface of the PMD layer 152 by an etch process, a tungsten CMP process, or a combination of both, leaving the contacts 154 extending to the top surface of the PMD layer 152. Other structures and compositions for the contacts 154 are within the scope of this example.

Interconnects 156 are formed on the PMD layer 152, making electrical connections to the contacts 154. The interconnects 156 are electrically conductive. In one version of this example, the interconnects 156 may have an etched aluminum structure, and may include an adhesion layer, not shown, of titanium nitride or titanium tungsten, on the PMD layer 152, an aluminum layer, not shown, with a few atomic percent of silicon, titanium, or copper, on the adhesion layer, and an anti-reflection layer, not shown, of titanium nitride on the aluminum layer. The etched aluminum interconnects may be formed by depositing the adhesion layer, the aluminum layer, and the anti-reflection layer, and forming an etch mask, not shown, followed by an RIE process to etch the anti-reflection layer, the aluminum layer, and the adhesion layer where exposed by the etch mask, and subsequently removing the etch mask. In another version of this example, the interconnects 156 may have a damascene structure, and may include a barrier liner of tantalum and tantalum nitride in an interconnect trench in an intra-metal dielectric (IMD) layer, not shown, on the PMD layer 152, with a copper fill metal in the interconnect trench on the barrier liner. The damascene interconnects may be formed by depositing the IMD layer on the PMD layer 152, and etching the interconnect trenches through the IMD layer to expose the contacts 154. The barrier liner may be formed by sputtering tantalum onto the IMD layer and exposed PMD layer 152 and contacts 154, and forming tantalum nitride on the sputtered tantalum by an ALD process. The copper fill metal may be formed by sputtering a seed layer, not shown, of copper on the barrier liner, and electroplating copper on the seed layer to fill the interconnect trenches. Copper and barrier liner metal is subsequently removed from a top surface of the IMD layer by a copper CMP process. In further version of this example, the interconnects 156 may have a plated structure, and may include an adhesion layer, not shown, on the PMD layer 152 and the contacts 154, with copper interconnects on the adhesion layer. The plated interconnects may be formed by sputtering the adhesion layer, containing titanium, on the PMD layer 152 and contacts 154, followed by sputtering a seed layer, not shown, of copper on the adhesion layer. A plating mask is formed on the adhesion layer that exposes areas for the interconnects 156. The copper interconnects are formed by electroplating copper on the seed layer where exposed by the plating mask. The plating mask is removed, and the seed layer and the adhesion layer are removed by wet etching between the interconnects.

In this example, instances of the field plate segments 140 that are in a same row 126 are directly electrically coupled to one of the interconnects 156 through the metal silicide 150 and the contacts 154. Instances of the field plate segments 140 that are not in a same row 126 are not directly electrically coupled to the same interconnect 156. Thus, the field plate segments 140 in one of the rows 126 may be biased independently of the field plate segments 140 in another of the rows 126.

During operation of the microelectronic device 100, a first operational potential is provided to the first region 116 of the semiconductor material 104. In this example, the first operational potential may be implemented by a drain potential applied to the drain contact region 148. In one version of this example, the drain potential may be generated by an external potential source that is external to the microelectronic device 100, and the microelectronic device 100 may be configured to provide the first potential to the first region 116 by the microelectronic device 100 having instances of the metal silicide 150, the contacts 154, and the interconnects 156 directly electrically coupled in series to the external potential source, for example, through an input/output (I/O) pad such as a bond pad or solder bump. In one version of this example, the drain potential may be generated by an internal potential source that is internal to the microelectronic device 100, and the microelectronic device 100 may be configured to provide the first potential to the first region 116 by the microelectronic device 100 having instances of the metal silicide 150, the contacts 154, and the interconnects 156 directly electrically coupled in series to the internal potential source.

Also during operation of the microelectronic device 100, a second operational potential is provided to the second region 120 of the semiconductor material 104. In this example, the second operational potential may be implemented by a source potential applied to the source region 146. In one version of this example, the source potential may be generated by an external potential source that is external to the microelectronic device 100; in another version, the source potential may be generated by an internal potential source that is internal to the microelectronic device 100. The microelectronic device 100 may be configured to provide the second potential to the second region 120 by the microelectronic device 100 having instances of the metal silicide 150, the contacts 154, and the interconnects 156 directly electrically coupled in series to the external potential source or the internal potential source, as appropriate.

When the MOS transistor 108 is in an off state, the first operational potential may be significantly higher, for example, 30 volts to 1000 volts higher, than the second operational potential. When the MOS transistor 108 is in an on state, the first operational potential may be a few volts higher than the second operational potential. In an alternate version of this example, in which the MOS transistor 108 is manifested as a p-channel MOS transistor, the first operational potential may be significantly lower than the second operational potential in the off state, and may be a few volts lower than the second operational potential in the on state.

Circuitry 158 is formed in the microelectronic device 100. The circuitry 158 is electrically connected to each of the field plate segments 140 through the interconnects 156, the contacts 154, and the metal silicide 150. The circuitry 158 is configured to apply bias potentials to the field plate segments 140. All the bias potentials are between the first operational potential and the second operational potential. The bias potentials are monotonic with respect to distances of the field plate segments 140 from the first region 116 of the semiconductor material 104. That is, the circuitry 158 is configured to provide bias potentials that are closer to the first operational potential for instances of the field plate segments 140 that are closer to the first region 116 than other instances of the field plate segments 140 that are farther from the first region 116. In this example, all the field plate segments 140 in one row 126 are a same distance from the first region 116, and are provided a same bias potential, as a result of being electrically coupled to a same interconnect 156 through electrically conductive elements of the microelectronic device 100. The circuitry 158 may include a resistor ladder 160 with internal nodes 162 electrically coupled through buffers 164 to the interconnects 156 in the rows 126, and end terminals of the resistor ladder 160 connected to the drain contact region 148 and the source region 146. The buffers 164 may be implemented as source follower buffers 164, as indicated schematically in FIG. 1K and FIG. 1L. Having the buffers 164 coupled between the internal nodes 162 and the interconnects 156 may enable the resistor ladder 160 to have a high impedance, advantageously reducing power consumption by the circuitry 158.

Figure 4A:
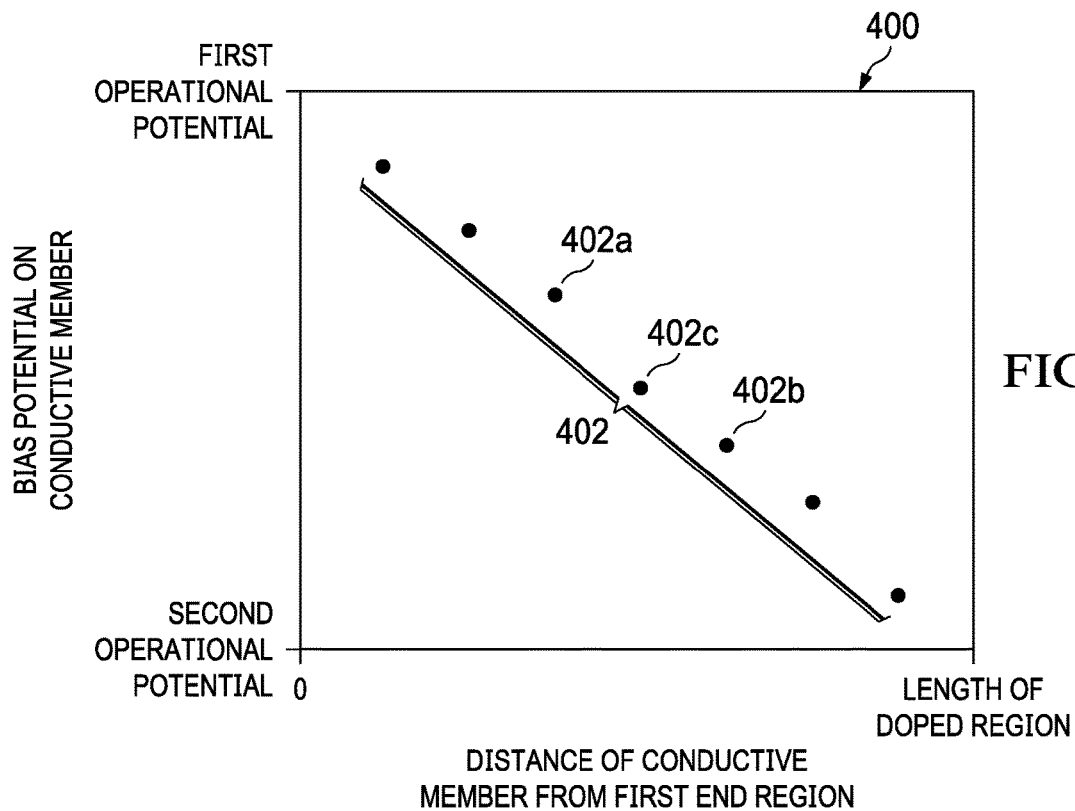
FIG. 4A and FIG. 4B are charts depicting example monotonic relationships between bias potentials and distances from a first region of a doped region.
Figure 4B:
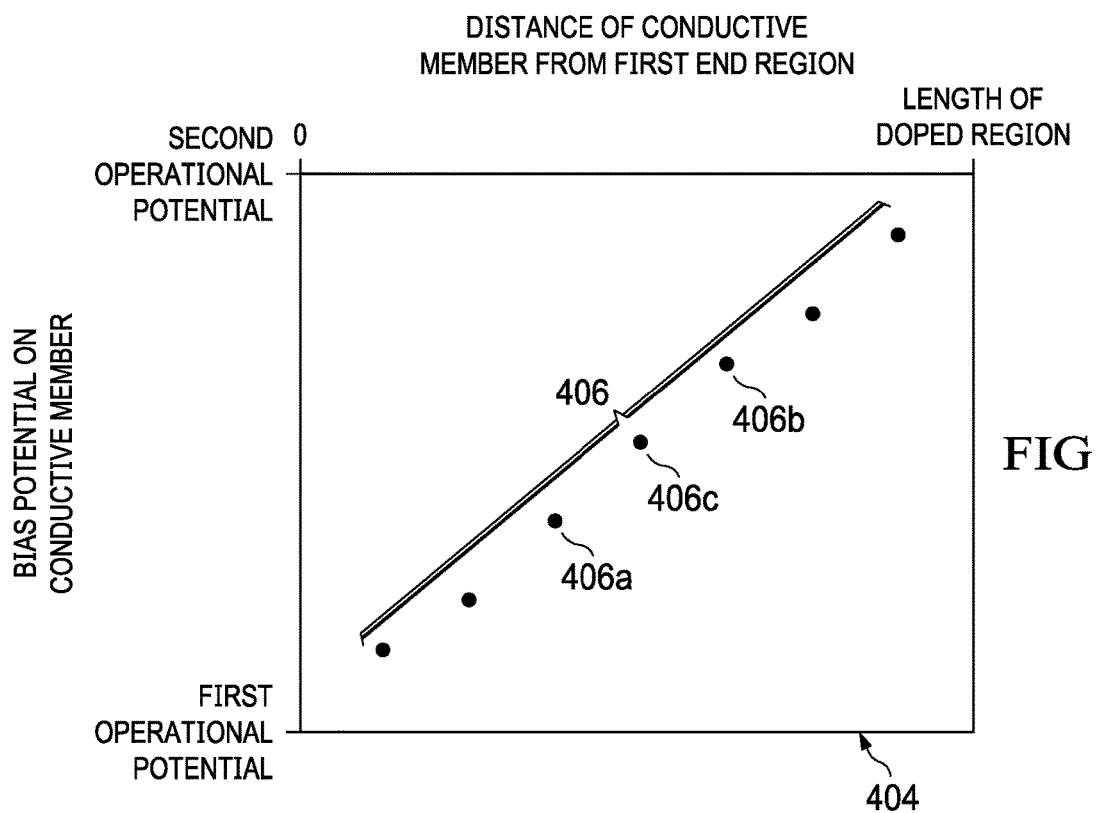

The monotonic relationship between the bias potentials and distances from the first region 116 is discussed in reference to FIG. 4A and FIG. 4B. To illustrate the monotonic relationship with respect to this example, the field plate segments 140 include a first field plate segment 140a nearest the first region 116, a second field plate segment 140b nearest the second region 120, and a third field plate segment 140c between the first field plate segment 140a and the second field plate segment 140b. The circuitry 158 is configured to apply a first bias potential to the first field plate segment 140a, apply a second bias potential to the second field plate segment 140b, and apply a third bias potential to the third field plate segment 140c. The first bias potential, the second bias potential, and the third bias potential are all between the first operational potential and the second operational potential. The first bias potential is between the first operational potential and the third bias potential. The second bias potential is between the third bias potential and the second operational potential. The third bias potential is between the first bias potential and the second bias potential.

Having the circuitry 158 configured to provide the bias potentials in the monotonic relationship with respect to distances of the field plate segments 140 from the first region 116 may reduce an electric field in the doped region 110, which may advantageously enable the MOS transistor 108 to operate at a higher drain bias with respect to the source bias, that is, higher value of the first operational potential, with respect to the second operational potential, in the off state, than a similar MOS transistor without field plate segments. Furthermore, having the circuitry 158 configured to provide the bias potentials as disclosed in this example may enable the doped region 110 to have a higher dopant concentration than the similar MOS transistor without field plate segments, in the on state, advantageously reducing an ohmic resistance of the doped region 110 compared to the similar MOS transistor. Having the field plate segments 140 arranged in seriate alternating rows 126 may provide a desired balance between uniformity of the electric field in the doped region 110 in the off state and ohmic resistance of the doped region 110 in the on state. The circuitry 158 is configured to adjust the bias potentials applied to the field plate segments 140 as the first operational potential and the second operational potential change during switching the MOS transistor 108 from the off state to the on state, and back to the off state, accruing the advantage of lower potential difference across the trench liners 128, and hence higher operating potential, as explained above.

Figure 2A:
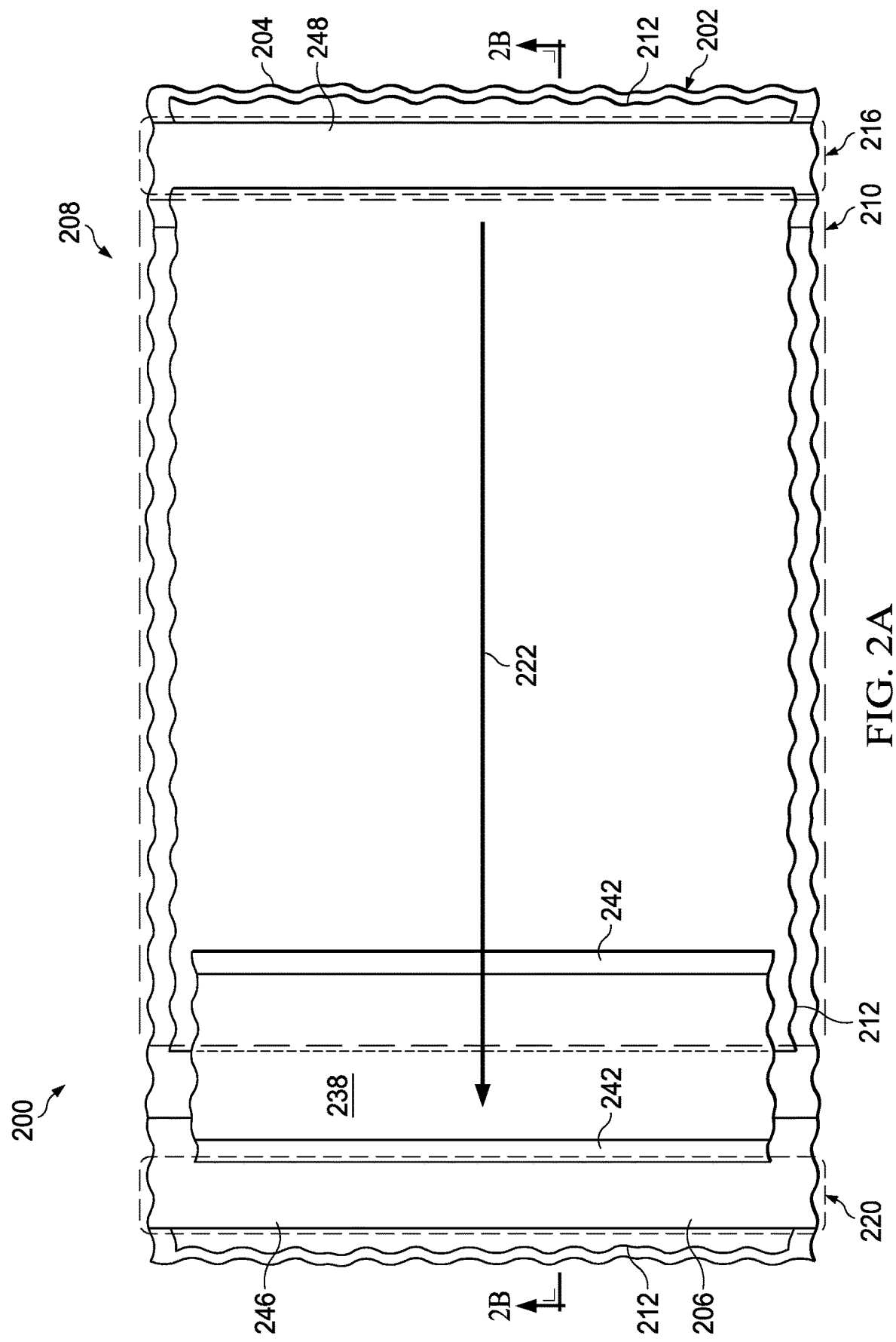
FIG. 2A through FIG. 2F are alternating top views and cross sections of another example microelectronic device having a doped region, depicted in stages of an example method of formation.
Figure 2B:
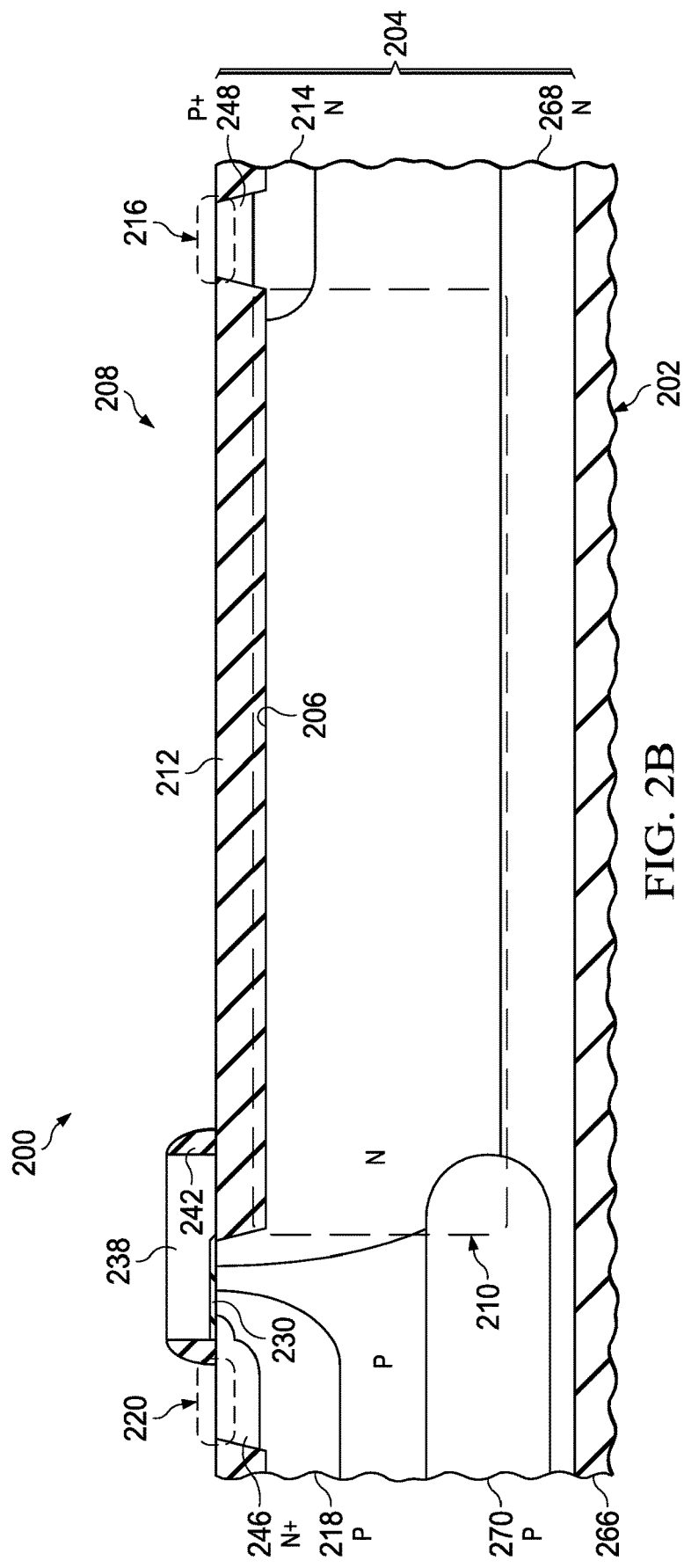

FIG. 2A through FIG. 2F are alternating top views and cross sections of another example microelectronic device having a doped region, depicted in stages of an example method of formation. Referring to FIG. 2A and FIG. 2B, the microelectronic device 200 is formed in and on a substrate 202. The substrate 202 of this example is part of an SOI wafer having a substrate dielectric layer 266 and a semiconductor material 204 which extends from the substrate dielectric layer 266 to a top surface 206 of the substrate 202. In alternate versions of this example, the substrate 202 may be implemented as a bulk semiconductor wafer, a wafer having an epitaxial semiconductor layer, or other structure suitable for forming the microelectronic device 200. The substrate 202 may include other microelectronic devices, not shown.

The microelectronic device 200 includes an active component 208. In this example, the active component 208 may be manifested as an NPN IGBT 208, and will be referred to as the IGBT 208 in the disclosure of this example. A doped region 210 is formed in the semiconductor material 204. The doped region 210 of this example is n-type, and may be formed by implanting n-type dopants, such as phosphorus, into the semiconductor material 204, followed by annealing the substrate 202 to diffuse and activate the n-type dopants. The doped region 210 may have an average dopant concentration of the n-type dopants of $1\times10^{16}$ cm$^{-2}$ to $1\times10^{17}$ cm$^{-2}$, by way of example. The doped region 210 is between a first region 216 in the semiconductor material 204 and a second region 220 in the semiconductor material 204. The doped region 210 of this example may provide a drift region 210 of the IGBT 208. The first region 216 may be implemented, in this example, as a collector contact region, and the second region 220 may be implemented, in this example, as an emitter contact region. In this example, an n-type buried layer 268 may be formed in the semiconductor material 204 below the doped region 210. The n-type buried layer 268 may extend across the semiconductor device 200. The n-type buried layer 268 may be formed before the doped region 210 is formed. The n-type buried layer 268 has a higher average dopant concentration of the n-type dopants than the doped region 210. By way of example, the n-type buried layer 268 may have an average dopant concentration of n-type dopants of $1\times10^{17}$ cm$^{-2}$ to $1\times10^{18}$ cm$^{-2}$.

A p-type buried layer 270 may be formed in the semiconductor material 204, under the second region 220 of the semiconductor material 204. The p-type buried layer 270 may be localized, or patterned, to extend only partway under the doped region 210 from the second region 220. The p-type buried layer 270 may be formed so that the semiconductor material 204 extends under the p-type buried layer 270, as depicted in FIG. 2B. Alternatively, the p-type buried layer 270 may be formed so as to extend to the substrate dielectric layer 266. The p-type buried layer 270 may be formed before the doped region 210 is formed.

A dielectric layer 212 is formed on the substrate 202, at the top surface 206. The dielectric layer 212 of this example extends over the doped region 210. The dielectric layer 212 may be implemented as field oxide 212, with a thickness of 250 nanometers to 500 nanometers. In one version of this example, the dielectric layer 212 may be formed by an STI process, which includes etching isolation trenches in the semiconductor material 204. The isolation trenches are with silicon dioxide by one or more deposition processes, including thermal oxidation, atmospheric pressure chemical vapor deposition (APCVD), HDP, or HARP. The deposition processes may be alternated with etchback processes, to reduce a thickness of the silicon dioxide over the top surface 206 of the substrate 202. The silicon dioxide over the top surface 206 by an oxide CMP process or an etchback process, or a combination of both. In another version of this example, the dielectric layer 212 may be formed by a LOCOS process. Alternatively, the dielectric layer 212 may be implemented as a field plate isolation layer. Other methods of forming the dielectric layer 212 are within the scope of this example.

A collector well 214 of the IGBT 208 is formed in the semiconductor material 204 under the first region 216 of the semiconductor material 204. The collector well 214 of this example is n-type, and has a higher average concentration of n-type dopants than the doped region 210. N-type dopants in the collector well 214 may include phosphorus and arsenic, for example. The collector well 214 may be formed by implanting the n-type dopants into the semiconductor material 204, and subsequently annealing the substrate 202 to activate and diffuse the n-type dopants.

A base region 218 of the IGBT 208 is formed in the semiconductor material 204 under the second region 220 of the semiconductor material 204. The base region 218 of this example is p-type, and may have an average concentration of p-type dopants, such as boron, of $1\times10^{17}$ cm$^{-2}$ to $1\times10^{18}$ cm$^{-2}$, by way of example. The base region 218 may be formed by implanting the p-type dopants into the semiconductor material 204, and subsequently annealing the substrate 202 to activate and diffuse the p-type dopants. In one version of this example, the n-type dopants may be implanted into the semiconductor material 204 for the drain well 214 and the p-type dopants may be implanted into the semiconductor material 204 for the base region 218, and the substrate 202 may be subsequently annealed to concurrently activate and diffuse thep-type dopants in the base region 218 and the n-type dopants in the drain well 214.

A gate dielectric layer 230 of the IGBT 208 is formed at the top surface 206 of the substrate 202, at the second region 220 of the semiconductor material 204. The gate dielectric layer 230 extends partway over the doped region 210 to the dielectric layer 212, and partway over the base region 218 adjacent to the doped region 210. The gate dielectric layer 230 of this example may include silicon dioxide, hafnium oxide, zirconium oxide, tantalum oxide, or other dielectric material, optionally with nitrogen added to improve reliability. The gate dielectric layer 230 of this example may have a thickness of 2 nanometers to 50 nanometers, by way of example.

A gate 238 of the IGBT 208 is formed on the gate dielectric layer 230 and extending partway onto the dielectric layer 212. The gate 238 may include polysilicon, metal silicide, as in a fully silicided (FUSI) gate, or one or more metals, such as titanium, titanium nitride, tantalum, or tantalum nitride, as in a metal replacement gate. Sidewall spacers 242 may be formed on vertical surfaces of the gate 238. The sidewall spacers 242 may have structures and compositions as disclosed in reference to the sidewall spacers 142 of FIG. 1K and FIG. 1L. In an alternate version of this example, the gate 238 may extend further on the dielectric layer 212 to provide a horizontal field plate, not shown, as disclosed in reference to FIG. 1I and FIG. 1J.

An emitter region 246 of the IGBT 208 is formed in the semiconductor material 204 at the second region 220, contacting the base region 218. The emitter region 246 is n-type, and has an average dopant concentration higher than the collector well 214, for example, above $1 \times 10^{18}$ cm$^{-2}$. The emitter region 246 may be formed by implanting or diffusing n-type dopants into the semiconductor material 204, followed by annealing the semiconductor material 204.

A collector injection region 248 of the IGBT 208 is formed in the semiconductor material 204 at the first region 216, contacting the collector well 214. The collector injection region 248 is p-type, and has an average concentration of p-type dopants above $1 \times 10^{18}$ cm$^{-2}$, by way of example. The collector injection region 248 may be formed by implanting or diffusing the p-type dopants into the semiconductor material 204, followed by annealing the semiconductor material 204.

Annealing the semiconductor material 204 for the emitter region 246 and the collector injection region 248 may be implemented as a rapid thermal anneal, a spike anneal, or a flash anneal, by way of example. A rapid thermal anneal may heat the substrate 202 to 1000° C. to 1150° C. for 5 seconds to 60 seconds, and may be implemented in a rapid thermal processor using an incandescent lamp. A spike anneal may heat the substrate 202 to 1100° C. to 1250° C. for 100 milliseconds seconds to 5 seconds, and may be implemented an arc flash lamp. A flash anneal may heat the substrate 202 to 1200° C. to 1350° C. for 50 microseconds to 1 millisecond, and may be implemented by a flash lamp or scanned laser. The annealing process may be selected to balance activating as many of the n-type dopants and p-type dopants as possible while controlling diffusion of the n-type dopants and p-type dopants.

During operation of the IGBT 208, current may flow from the first region 216 of the semiconductor material 204 to the second region 220, parallel to a current flow direction 222 which extends from the first region 216 to the second region 220.

Figure 2C:
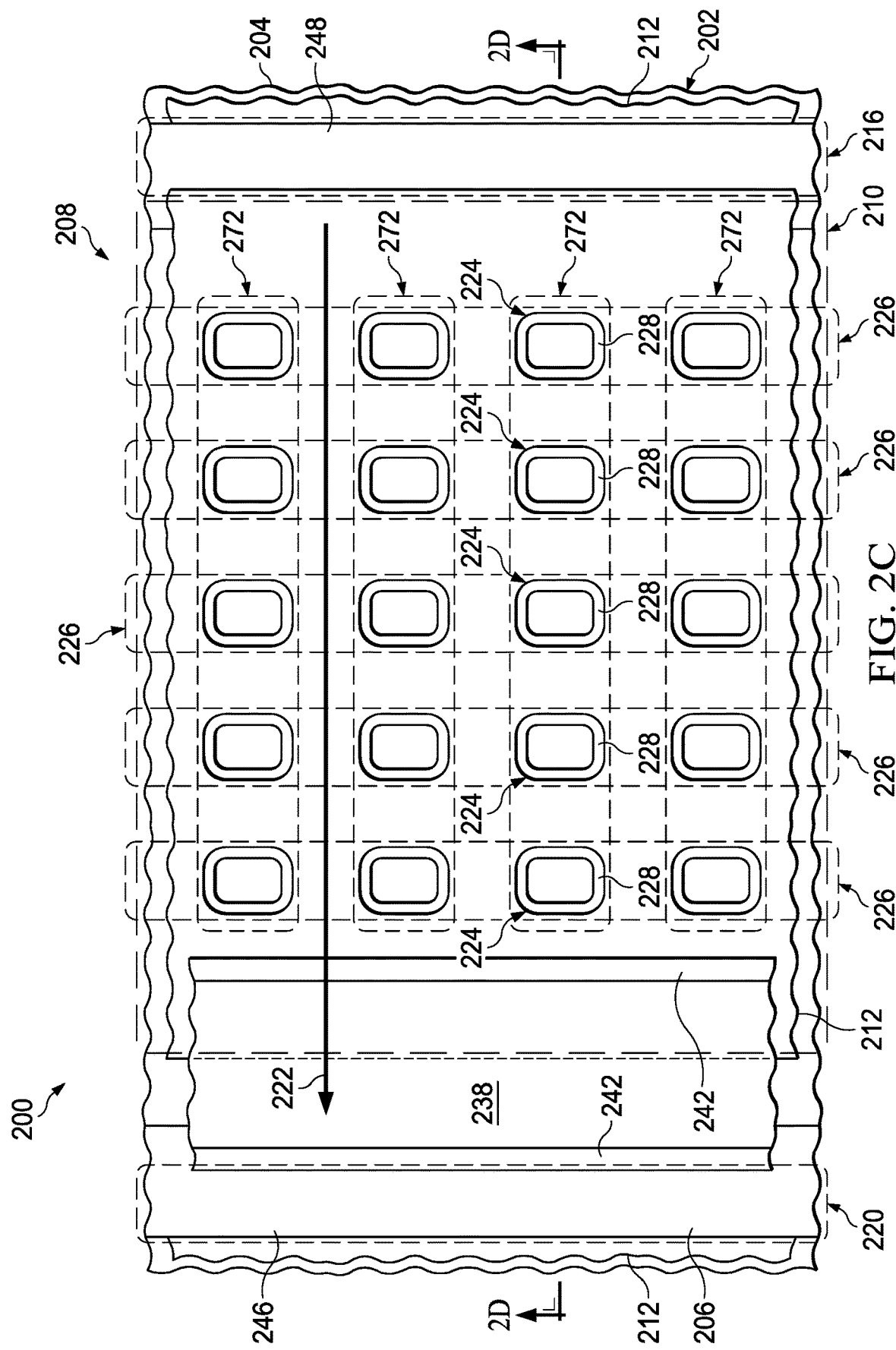
Figure 2D:
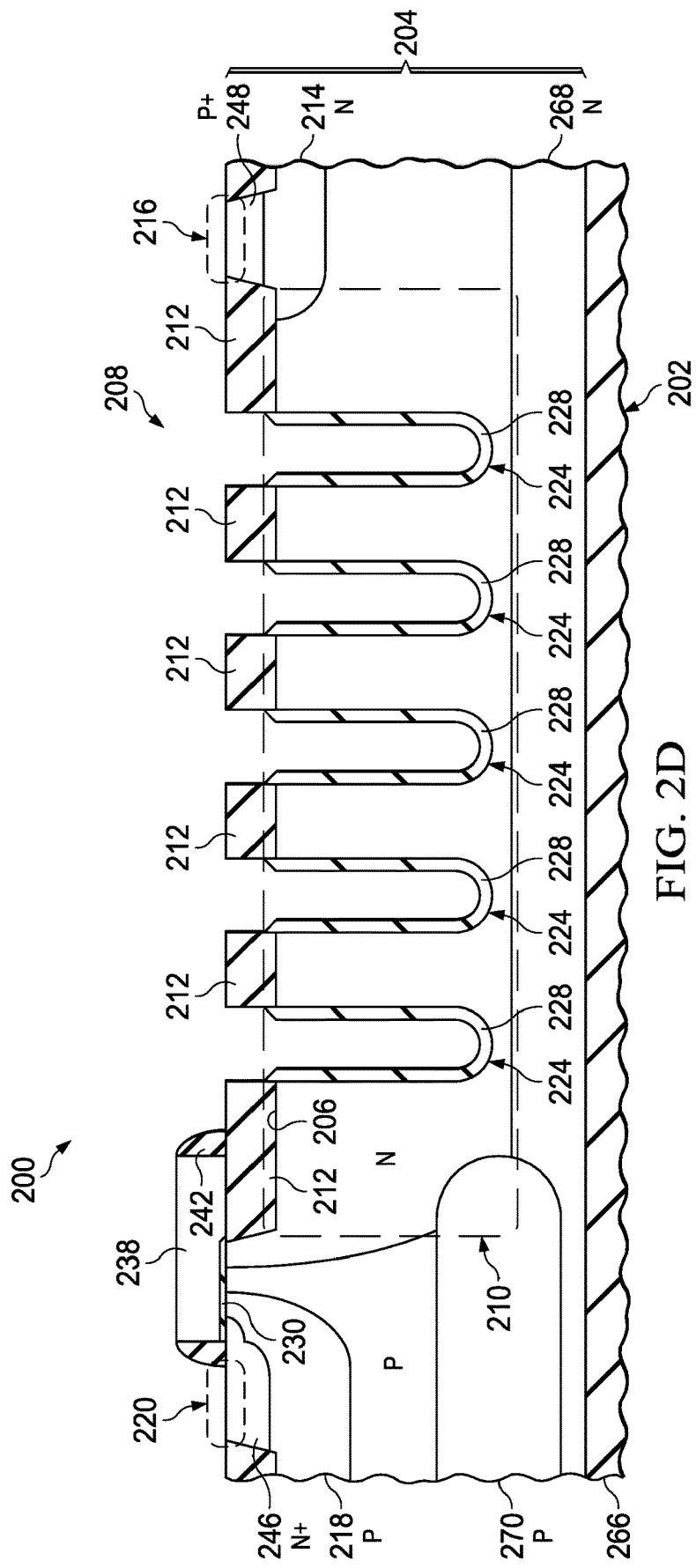

Referring to FIG. 2C and FIG. 2D, trenches 224 are formed through the dielectric layer 212 and in the semiconductor material 204 from the top surface 206, extending into the doped region 210. In this example, the trenches 224 may terminate in the doped region 210, so that the doped region 210 extends under the trenches 224, as depicted in FIG. 2D. The trenches 224 may have lateral dimensions similar to the trenches 124 of FIG. 1C and FIG. 1D. The trenches 224 may have rounded rectangular shapes with unequal lateral dimensions, in which the larger lateral dimension is oriented perpendicular to the current flow direction 222, as depicted in FIG. 2C. Other shapes and orientations for the trenches 224 are within the scope of this example.

The trenches 224 may be arranged in rows 226 and columns 272. Each row 226 is perpendicular to the current flow direction 222, and each column 272 is parallel to the current flow direction 222, as depicted in FIG. 2C. Instances of the trenches 224 in a same row 226 are equidistant from the first region 216 of the semiconductor material 204, within fabrication tolerances encountered in forming the microelectronic device 200. Other arrangements of the trenches 224 are within the scope of this example. The trenches 224 may be formed as disclosed for the trenches 124 of FIG. 1C and FIG. 1D.

Trench liners 228 are formed in the trenches 224, contacting the semiconductor material 204. The trench liners 228 may include primarily thermal oxide, or may include thermal oxide and one or more layers of deposited dielectric material such as silicon nitride or silicon oxynitride, formed by a PECVD process. The trench liners 228 may have a thickness of 5 nanometers to 50 nanometers, which may advantageously enable more complete charge balance in the doped region 210 during operation of the MOS transistor 208 compared to thicker trench liners 228. Forming the trench liners 228 separately from the gate dielectric layer 230 may advantageously enable the thicknesses and compositions of the trench liners 228 and the gate dielectric layer 230 to be independently optimized.

Figure 2E:
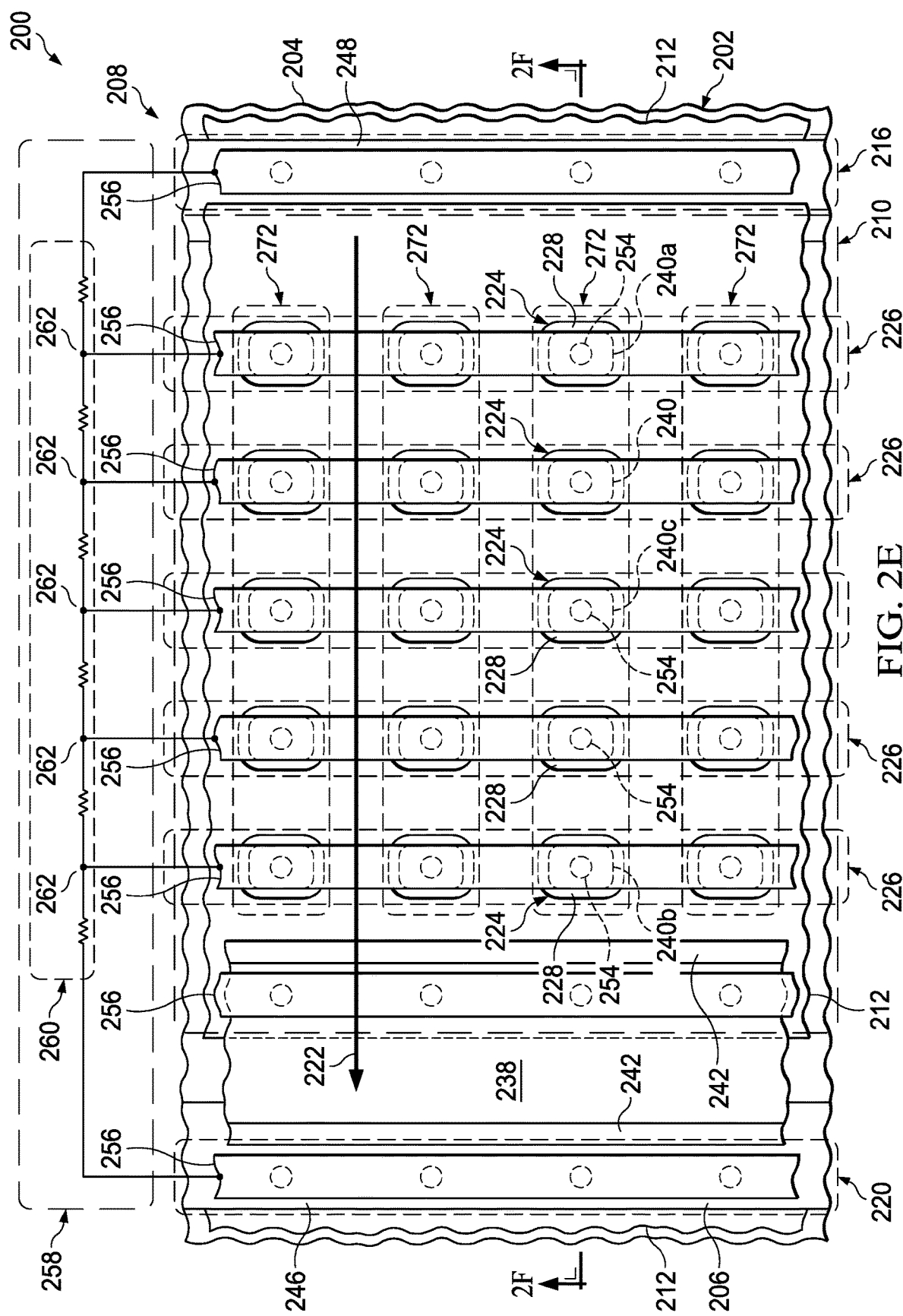
Figure 2F:
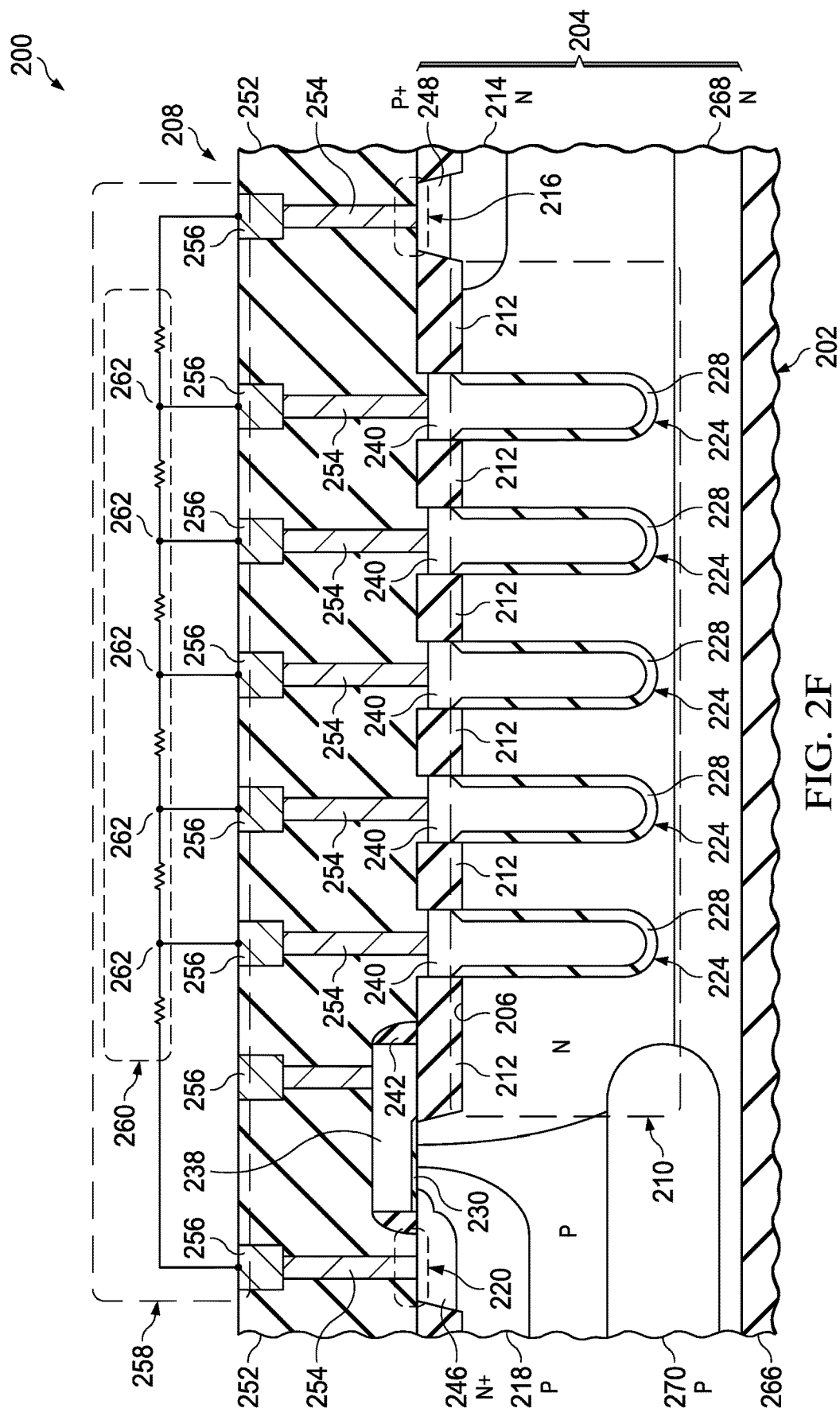

Referring to FIG. 2E and FIG. 2F, field plate segments 240 are formed in the trenches 224 on the trench liners 228. The field plate segments 240 are electrically conductive, and may include polysilicon, aluminum, copper, titanium, titanium nitride, tantalum, tantalum nitride, by way of example. The field plate segments 240 may be formed using a sputter process, an electroplating process, an ALD process, or any combination thereof. Other processes for forming the field plate segments 240 are within the scope of this example.

A PMD layer 252 of the microelectronic device 200 is formed over the substrate 202, the dielectric layer 212 the gate 238, and the field plate segments 240. The PMD layer 252 may have a similar layer structure and composition as disclosed for the PMD layer 152 of FIG. 1K and FIG. 1L. Contacts 254 are formed through the PMD layer 252, making electrical connections to the field plate segments 240, the gate 238, the emitter region 246, and the collector injection region 248. Each of the field plate segments 240 is electrically coupled through electrically conductive elements or directly electrically connected to at least one corresponding contact 254 The contacts 254 are electrically conductive. The contacts 254 may have a structure and composition, and may be formed, as disclosed for the contacts 154 of FIG. 1K and FIG. 1L. Interconnects 256 are formed on the PMD layer 252, making electrical connections to the contacts 254. The interconnects 256 are electrically conductive. The interconnects 256 may have a structure and composition, and may be formed, as disclosed for the interconnects 156 of FIG. 1K and FIG. 1L. In this example, instances of the field plate segments 240 that are in a same row 226 are directly electrically coupled to one of the interconnects 256 through the contacts 254. Instances of the field plate segments 240 that are not in a same row 226 are not directly electrically coupled to the same interconnect 256. Thus, the field plate segments 240 in one of the rows 226 may be biased independently of the field plate segments 240 in another of the rows 226. The PMD layer 252 is not shown in FIG. 2E, to depict the remaining elements of the microelectronic device 200 more clearly.

During operation of the microelectronic device 200, a first operational potential is provided to the first region 216 of the semiconductor material 204. In this example, the first operational potential may be implemented as a collector potential applied to the collector injection region 248. Also during operation of the microelectronic device 200, a second operational potential is provided to the second region 220 of the semiconductor material 204. In this example, the second operational potential may be implemented as an emitter potential applied to the emitter region 246. When the IGBT 208 is in an off state, the first operational potential may be significantly higher, for example, 30 volts to 1000 volts higher, than the second operational potential. When the IGBT 208 is in an on state, the first operational potential may be a few volts higher than the second operational potential. In an alternate version of this example, in which the IGBT 208 is manifested as a PNP IGBT, the first operational potential may be significantly lower than the second operational potential in the off state, and may be a few volts lower than the second operational potential in the on state.

Circuitry 258 is formed in the microelectronic device 200. The circuitry 258 is configured to apply bias potentials to each of the field plate segments 240 through the interconnects 256 and the contacts 254. All the bias potentials are between the first operational potential and the second operational potential. The circuitry 258 may include a resistor ladder 260 with internal nodes 262 electrically coupled to the interconnects 256 in the rows 226. End terminals of the resistor ladder 260 may be connected to the collector injection region 248 and the emitter region 246. The internal nodes 262 may be directly electrically coupled to the interconnects 256, as indicated schematically in FIG. 2E and FIG. 2F. Having the internal nodes 262 of the resistor ladder 260 directly electrically coupled to the interconnects 256 may reduce complexity and area of the circuitry 258, and thus advantageously reduce fabrication cost and complexity of the microelectronic device 200.

The bias potentials are monotonic with respect to distances of the field plate segments 240 from the first region 216 of the semiconductor material 204, as explained in reference to FIG. 1K and FIG. 1L. To illustrate the monotonic relationship with respect to this example, the field plate segments 240 include a first field plate segment 240a nearest the first region 216, a second field plate segment 240b nearest the second region 220, and a third field plate segment 240c between the first field plate segment 240a and the second field plate segment 240b. The circuitry 258 is configured to apply a first bias potential to the first field plate segment 240a, apply a second bias potential to the second field plate segment 240b, and apply a third bias potential to the third field plate segment 240c. The first bias potential, the second bias potential, and the third bias potential are all between the first operational potential and the second operational potential. The first bias potential is between the first operational potential and the third bias potential. The second bias potential is between the third bias potential and the second operational potential. The third bias potential is between the first bias potential and the second bias potential.

Having the circuitry 258 configured to provide the bias potentials in the monotonic relationship with respect to distances of the field plate segments 240 from the first region 216 may accrue the advantages disclosed in reference to the MOS transistor 108 of FIG. 1K and FIG. 1L. Having the field plate segments 240 arranged in rows 226 and columns 272 may provide a desired low ohmic resistance of the doped region 210 in the on state. The circuitry 258 is configured to adjust the bias potentials applied to the field plate segments 240 as the first operational potential and the second operational potential change during switching the MOS transistor 208 from the off state to the on state, and back to the off state, accruing the advantage of lower potential difference across the trench liners 228, and hence higher operating potential, as explained above. Forming the field plate segments 240 to include aluminum or copper may reduce a resistance of the field plate segments 240 compared to polysilicon, and so reduce a resistor-capacitor (RC) time constant of the field plate segments 240 combined with the trench liners 228, advantageously enabling the field plate segments 240 to follow changes in the first operational potential and the second operational potential.

Figure 3A:
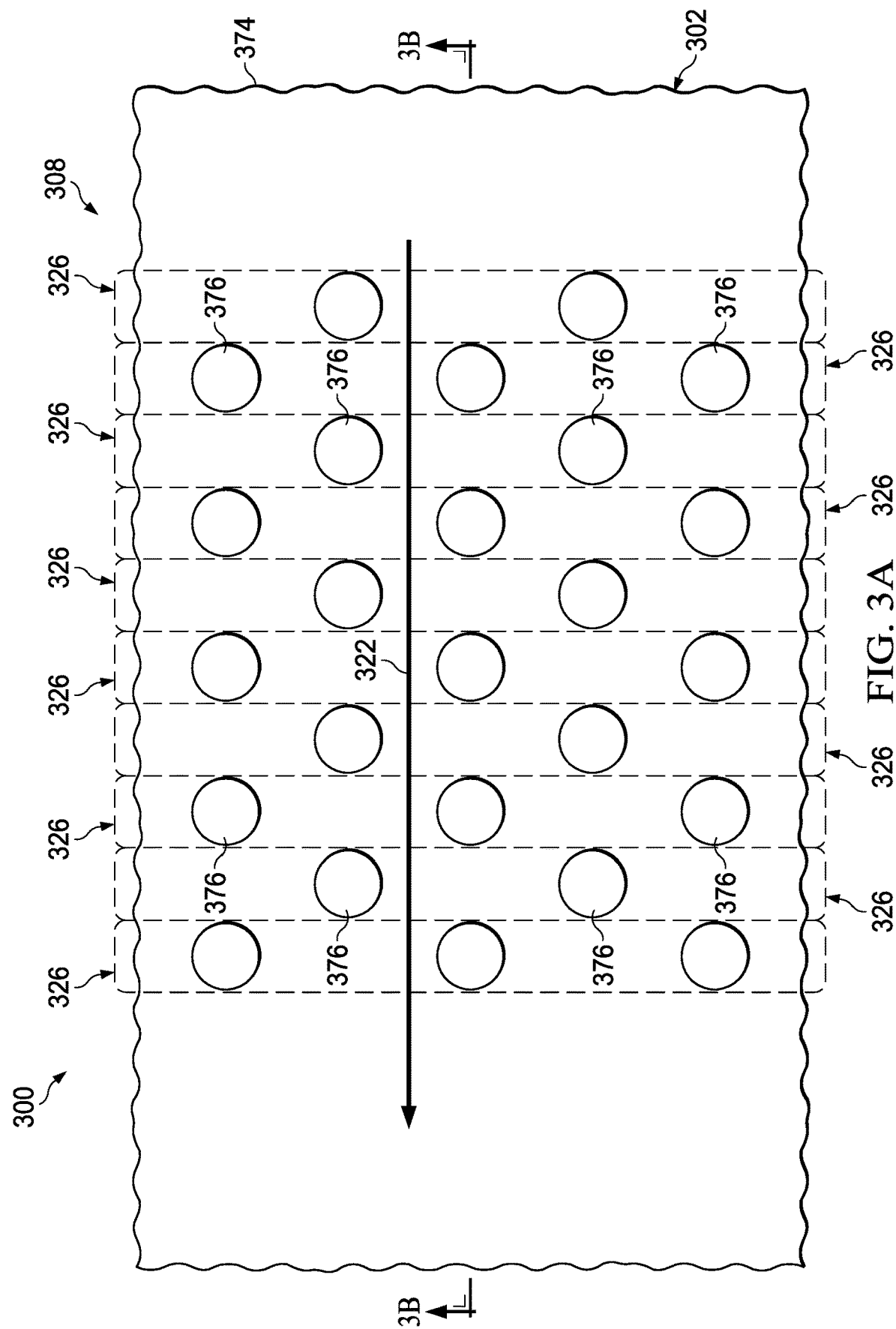
FIG. 3A through FIG. 3J are alternating top views and cross sections of a further example microelectronic device having a doped region, depicted in stages of an example method of formation.
Figure 3B:
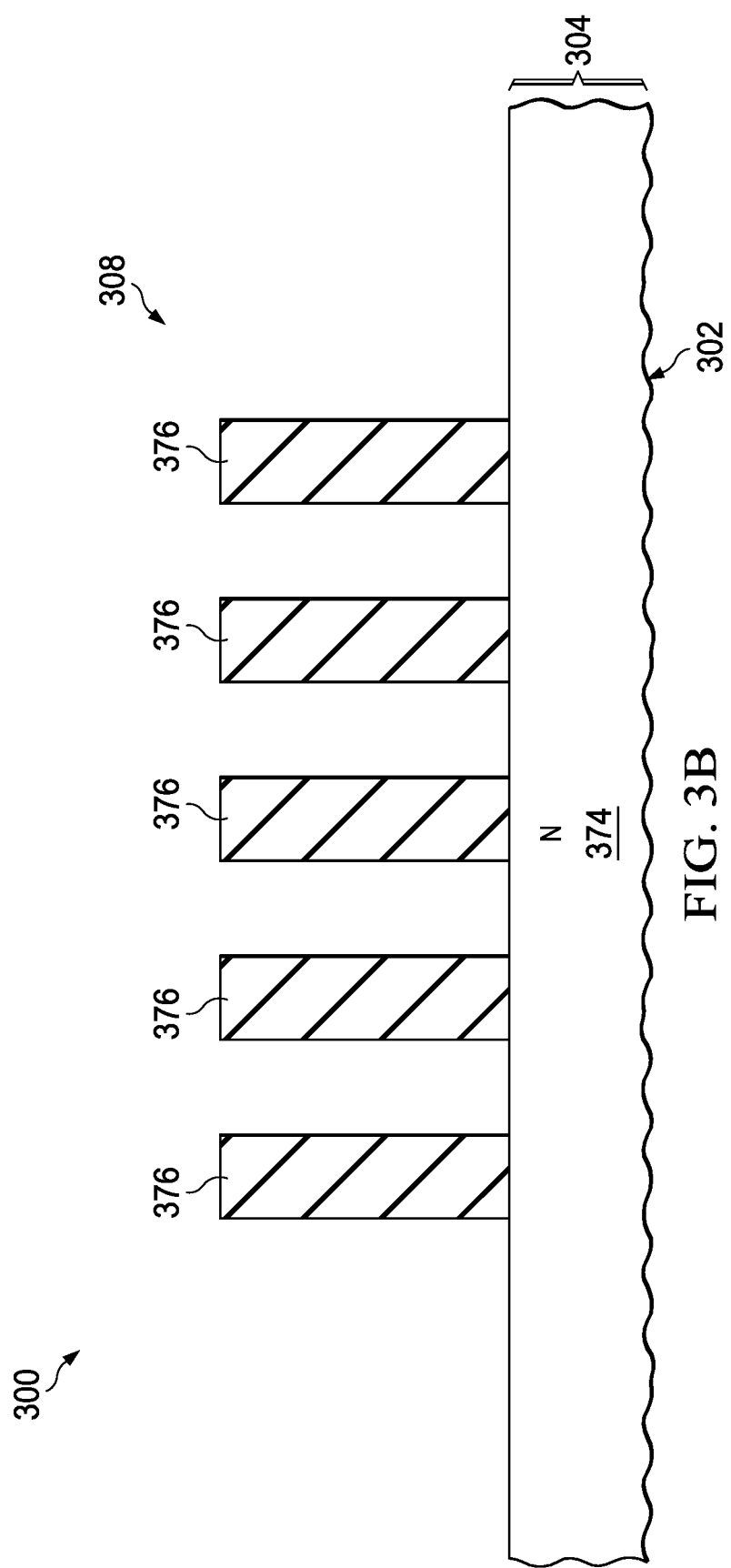

FIG. 3A through FIG. 3J are alternating top views and cross sections of a further example microelectronic device having a doped region, depicted in stages of an example method of formation. Referring to FIG. 3A and FIG. 3B, the microelectronic device 300 is formed in and on a substrate 302. The substrate 302 of this example may be part of a semiconductor wafer. The substrate 302 has a semiconductor material 304 which includes a base semiconductor material 374. In this example, the base semiconductor material 374 may be n-type, as indicated in FIG. 3B. The substrate 302 may include other microelectronic devices, not shown. The microelectronic device 300 includes an active component 308. In this example, the active component 308 may be manifested as Schottky diode 308.

Epitaxial-blocking pillars 376 are formed on the base semiconductor material 374 to define regions for subsequently-formed trenches 324, shown in FIG. 3E and FIG. 3F. The epitaxial-blocking pillars 376 include material such as silicon dioxide, silicon nitride, or silicon-doped boron nitride or other epitaxial-blocking material which blocks formation of epitaxial silicon. The epitaxial-blocking pillars 376 may be formed by forming a layer of the epitaxial-blocking material on the base semiconductor material 374, and forming an etch mask, not shown, over the layer of the epitaxial-blocking material to define areas for the epitaxial-blocking pillars 376. The layer of the epitaxial-blocking material is removed where exposed by the etch mask, leaving the epitaxial-blocking material under the etch mask to form the epitaxial-blocking pillars 376. The epitaxial-blocking pillars 376 may have lateral dimensions similar to the lateral dimensions disclosed for the trenches 124 of FIG. 1C and FIG. 1D. The epitaxial-blocking pillars 376 have vertical dimensions greater than a thickness of a subsequently-formed doped region 310, shown in FIG. 3C and FIG. 3D.

During operation of the Schottky diode 308, current may flow in the subsequently-formed doped region 310, shown in FIG. 3C and FIG. 3D, parallel to a current flow direction 322. The epitaxial-blocking pillars 376 may be arranged in alternating rows 326, so that each epitaxial-blocking pillar 376 is equidistant from neighboring epitaxial-blocking pillars 376.

Figure 3C:
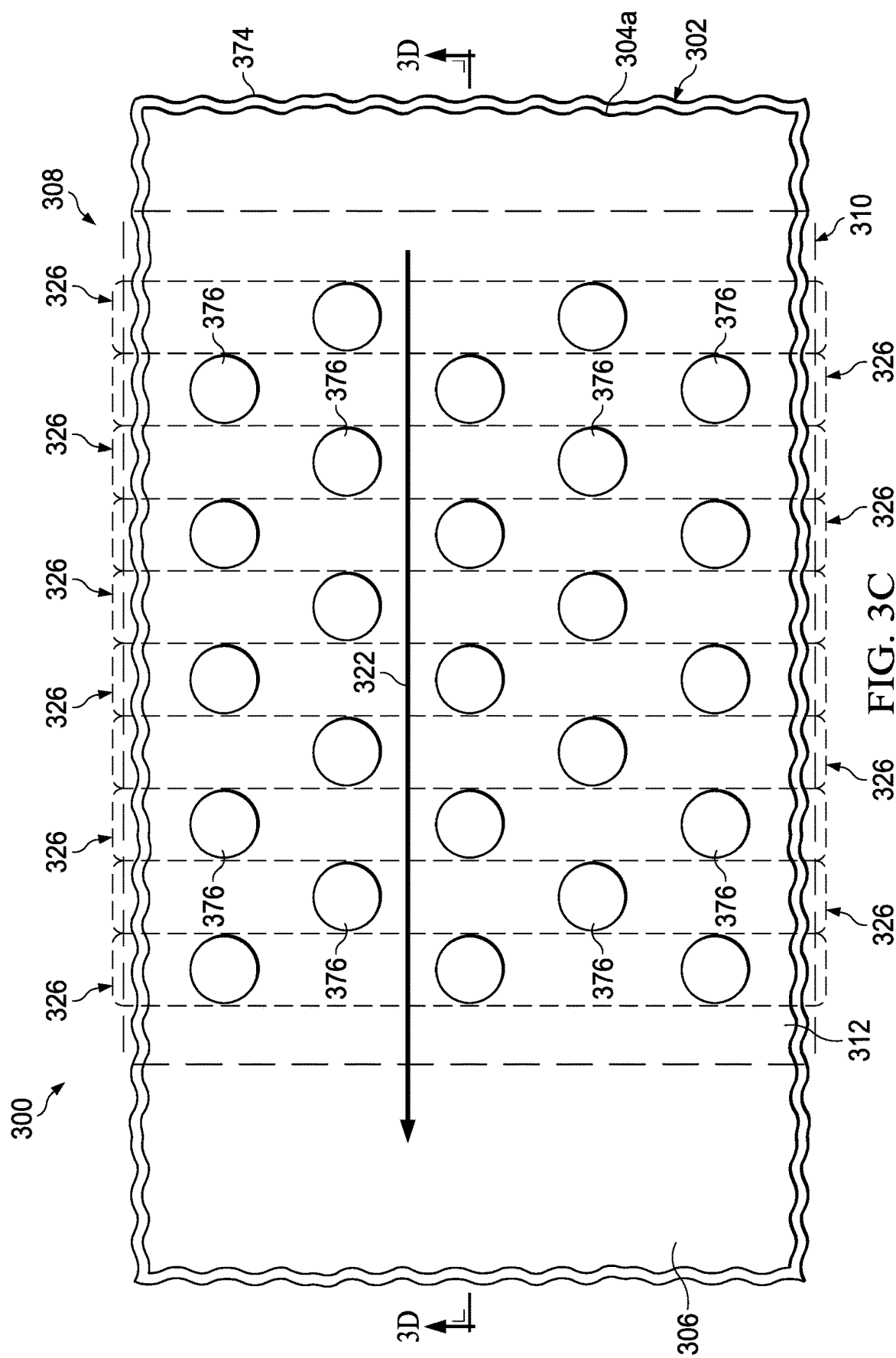
Figure 3D:
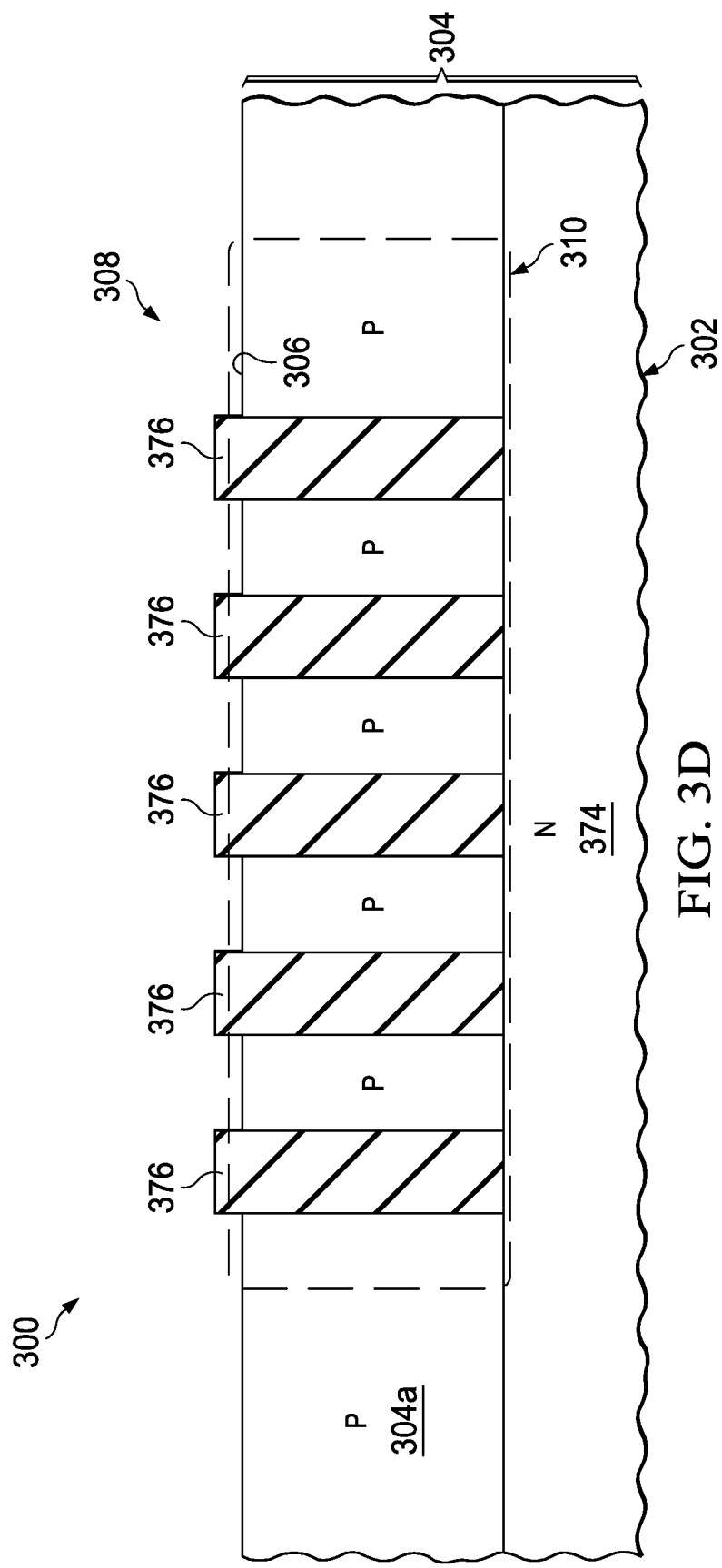

Referring to FIG. 3C and FIG. 3D, a semiconductor layer 304a of the semiconductor material 304 is formed on the base semiconductor material 374 where exposed by the epitaxial-blocking pillars 376. The semiconductor layer 304a may be formed by an epitaxial process. The semiconductor layer 304a includes a doped region 310. The epitaxial process may include thermal decomposition of silane ($SiH_4$) or disilane ($Si_2H_6$) to form silicon in the doped region 310. Other processes to form the doped region 310 are within the scope of this example. The semiconductor layer 304a formed by the epitaxial process may extend past the doped region 310, as depicted in FIG. 3D. The doped region 310 extends to a top surface 306 of the substrate 302. The top surface 306 of this example may extend proximate to tops of the epitaxial-blocking pillars 376, so that a thickness of the doped region 310 is less than a vertical dimension of the epitaxial-blocking pillars 376.

Figure 3E:
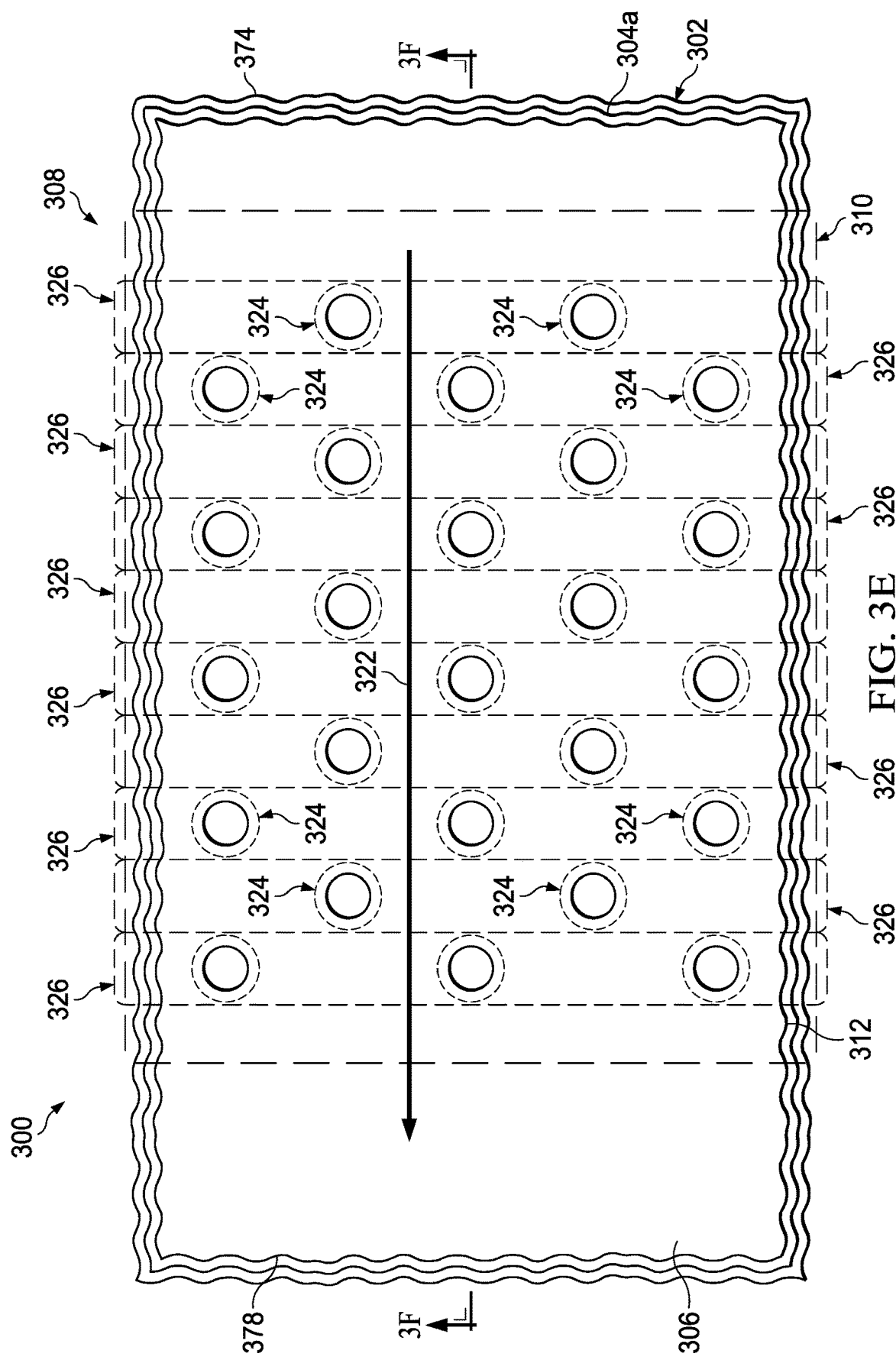
Figure 3F:
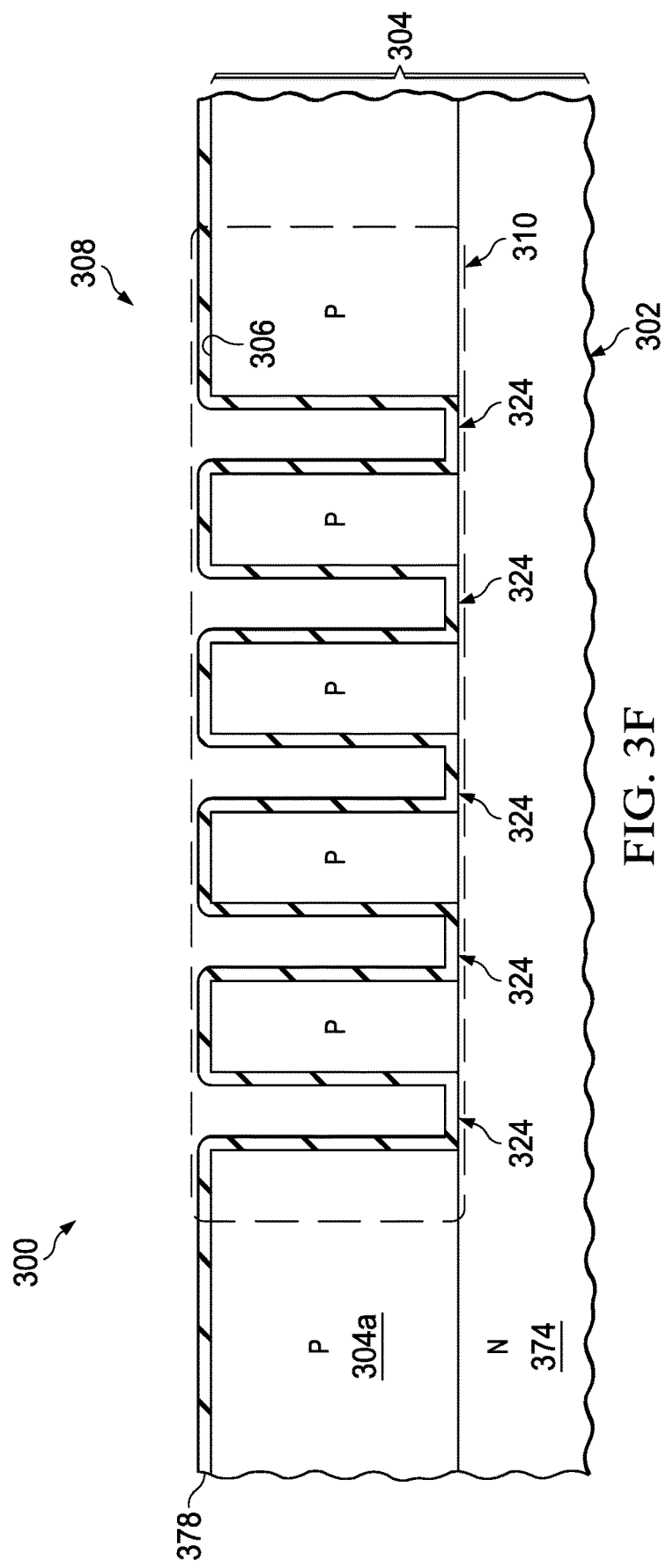

Referring to FIG. 3E and FIG. 3F, the epitaxial-blocking pillars 376 of FIG. 3C and FIG. 3D are removed, leaving trenches 324 in the doped region 310. The epitaxial-blocking pillars 376 may be removed by a wet etch process which has high selectivity to the doped region 310. For example, the wet etch process may use a dilute aqueous buffered solution of hydrofluoric acid. Other processes for removing the epitaxial-blocking pillars 376 are within the scope of this example. The trenches 324 may have lateral dimensions similar to the lateral dimensions disclosed for the trenches 124 of FIG. 1C and FIG. 1D. Each trench 324 of this example is equidistant from neighboring trenches 324.

A trench liner layer 378 is formed on the doped region 310, extending into the trenches 324 and onto the base semiconductor material 374. The trench liner layer 378 may be formed by a thermal oxidation process, or a combination of a thermal oxidation process followed by a dielectric deposition process, such as a PECVD process.

Figure 3G:
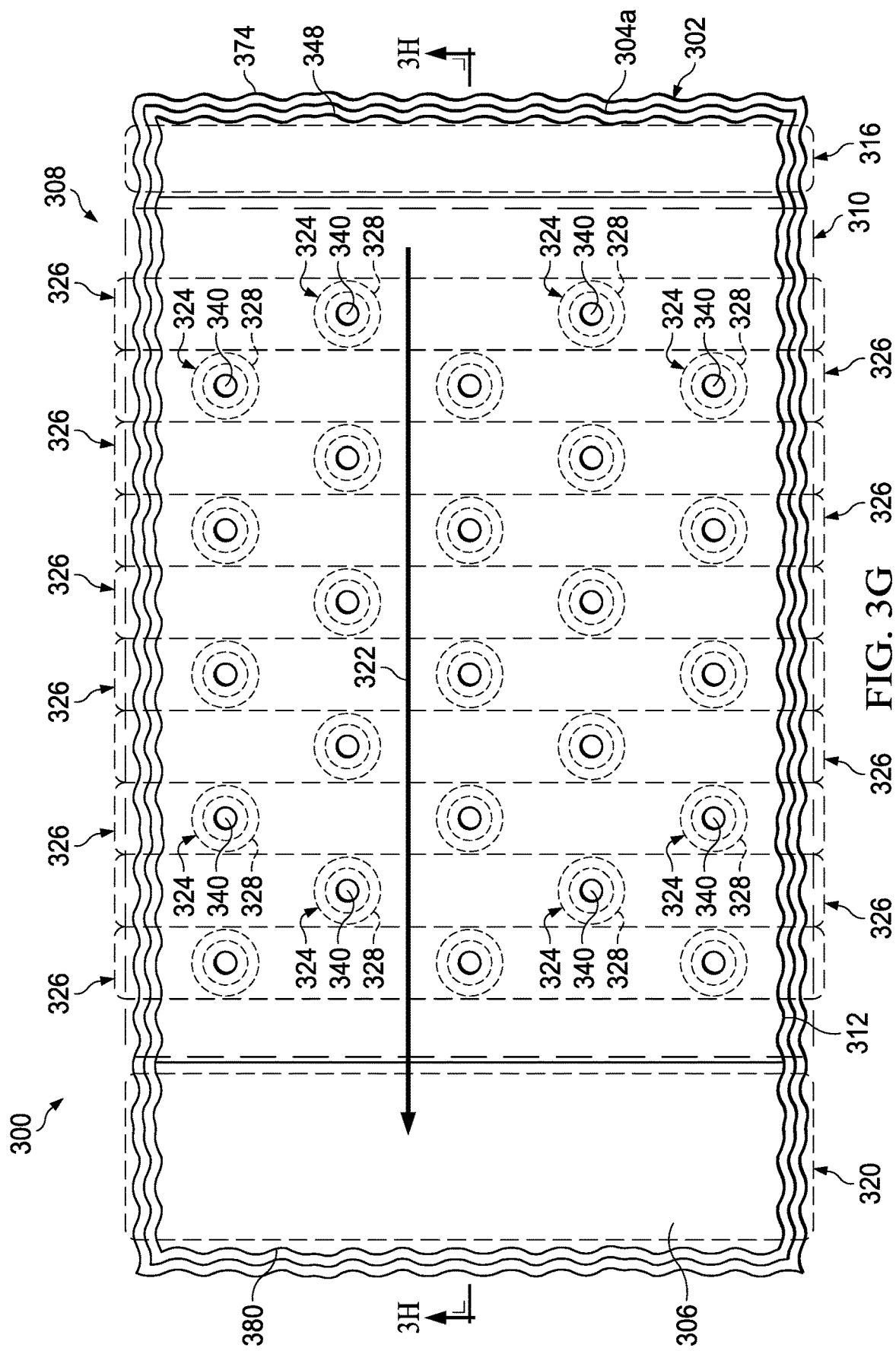
Figure 3H:
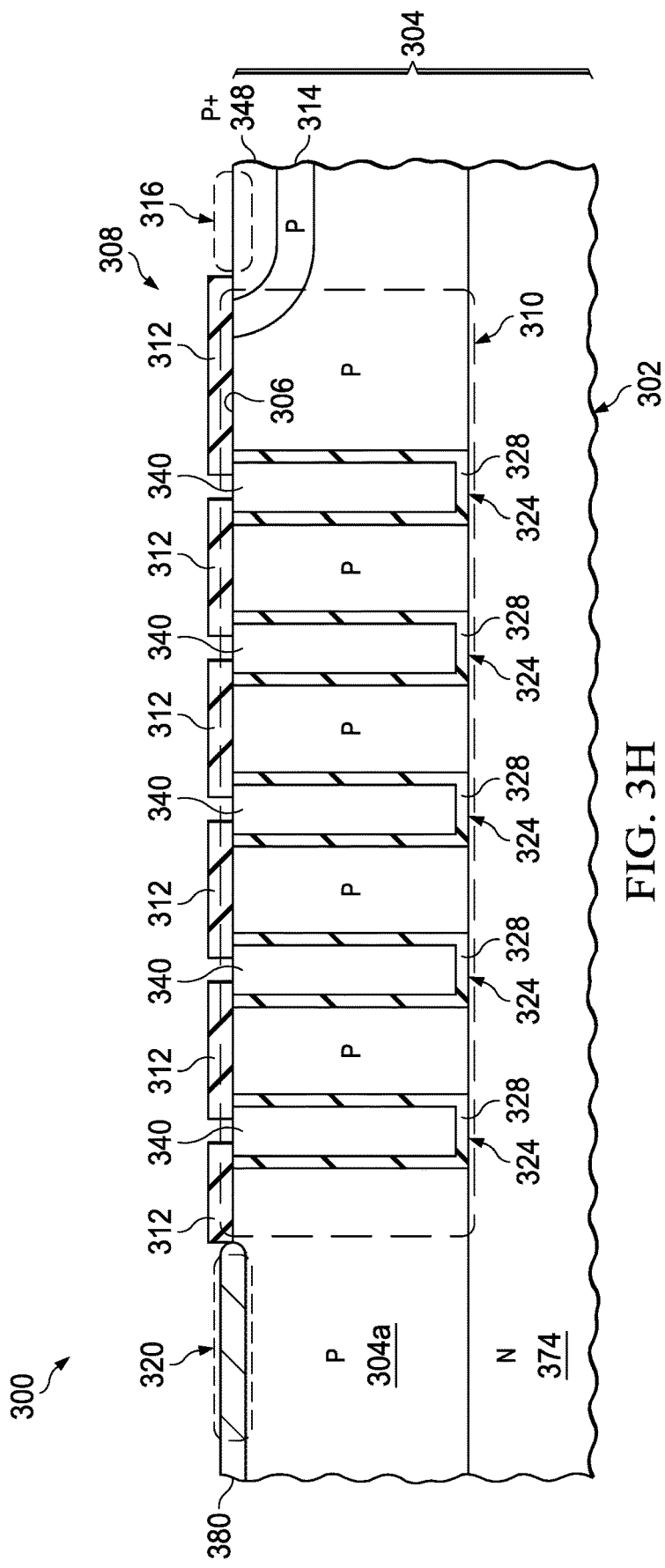

Referring to FIG. 3G and FIG. 3H, an anode well 314 of the Schottky diode 308 is formed in the semiconductor material 304. The anode well 314 contacts the doped region 310. An anode contact region 348 is formed in the semiconductor material 304 at a first region 316 of the semiconductor material 304, contacting the anode well 314. Both the anode well 314 and the anode contact region 348 are p-type. The anode well 314 has a higher average concentration of p-type dopants than the doped region 310, and the anode contact region 348 has a higher average concentration of p-type dopants than the anode well 314.

Electrically conductive material is formed on the trench liner layer 378 of FIG. 3E and FIG. 3F, extending into the trenches 324. The electrically conductive material is removed from over the top surface 306 of the substrate 302, leaving the electrically conductive material in the trenches 324 to form field plate segments 340. The field plate segments 340 may include polysilicon, one or more metals, carbon-based material such as graphene, or an electrically conductive polymer, by way of example.

The trench liner layer 378 in the trenches 324 forms trench liners 328, which separate the field plate segments 340 from the semiconductor material 304. The trench liner layer 378 over the top surface 306 may optionally be removed, as depicted in FIG. 3H. Alternatively, a portion, or all, of the trench liner layer 378 may be left in place over the top surface 306.

A dielectric layer 312 is formed over the top surface 306 of the substrate 302. The dielectric layer 312 may include silicon dioxide, silicon nitride, silicon oxynitride, boron nitride, aluminum oxide, polyimide, or other dielectric material. The dielectric layer 312 may be formed by forming a layer of dielectric material, not shown, over the top surface 306, followed by patterning the layer of dielectric material to expose the field plate segments 340 and areas for a cathode 380 of the Schottky diode 308.

The cathode 380 of the Schottky diode 308 is formed at the top surface 306 over a second region 320 of the semiconductor material 304, proximate to the doped region 310. The doped region 310 is between the first region 316 and the second region 320. The cathode 380 may include one or more metals, such as molybdenum, platinum, chromium, or tungsten, or may include metal silicide, such as platinum silicide, or palladium silicide. Metal in the cathode 380 may be formed by sputtering a layer of the metal on the microelectronic device 300 or forming the layer of the metal by an MOCVD process, followed by patterning the layer of the metal by an etch process. Metal silicide in the cathode 380 may be formed by a method similar to the method disclosed for forming the metal silicide 150 of FIG. 1K and FIG. 1L.

Figure 3I:
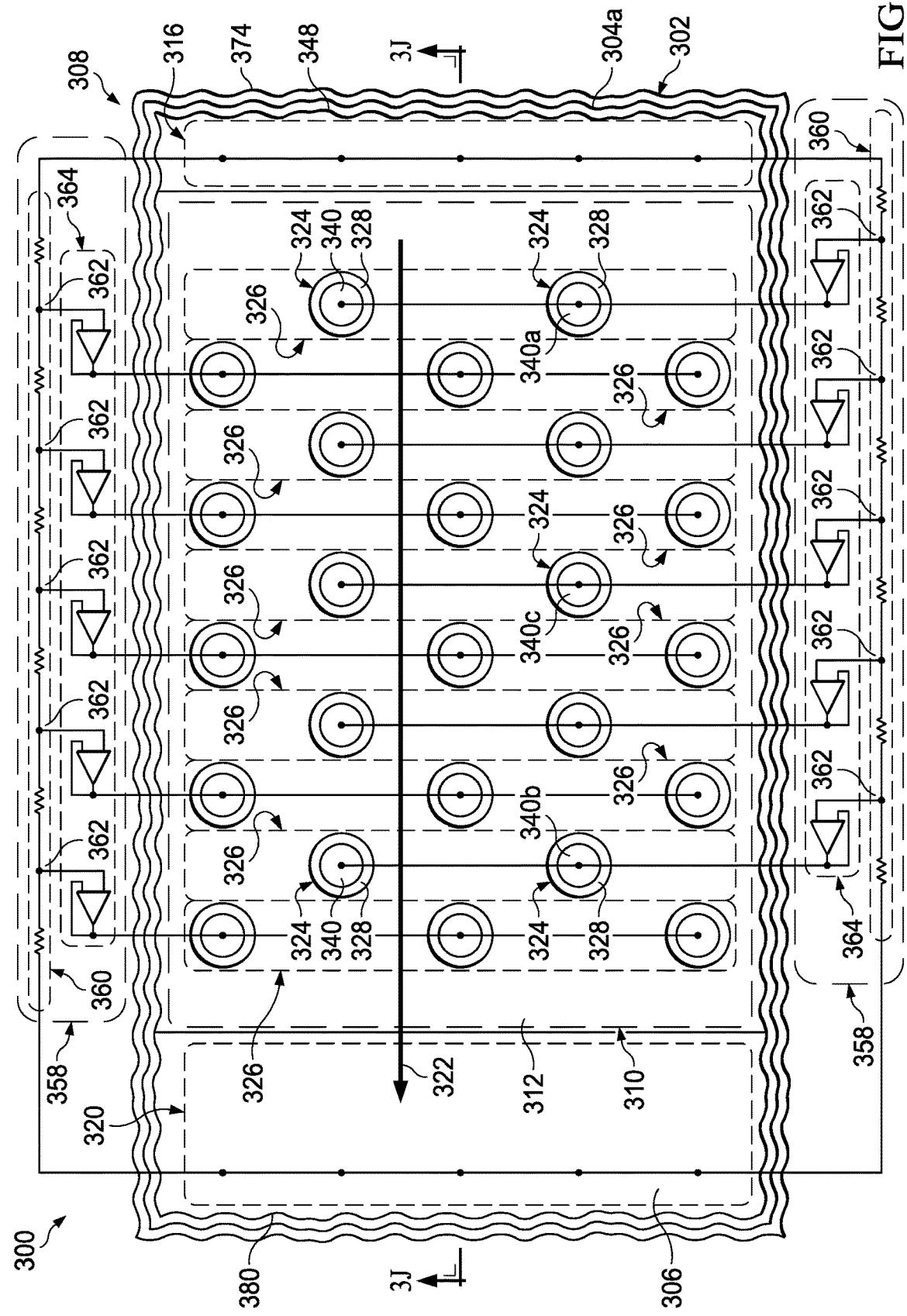
Figure 3J:
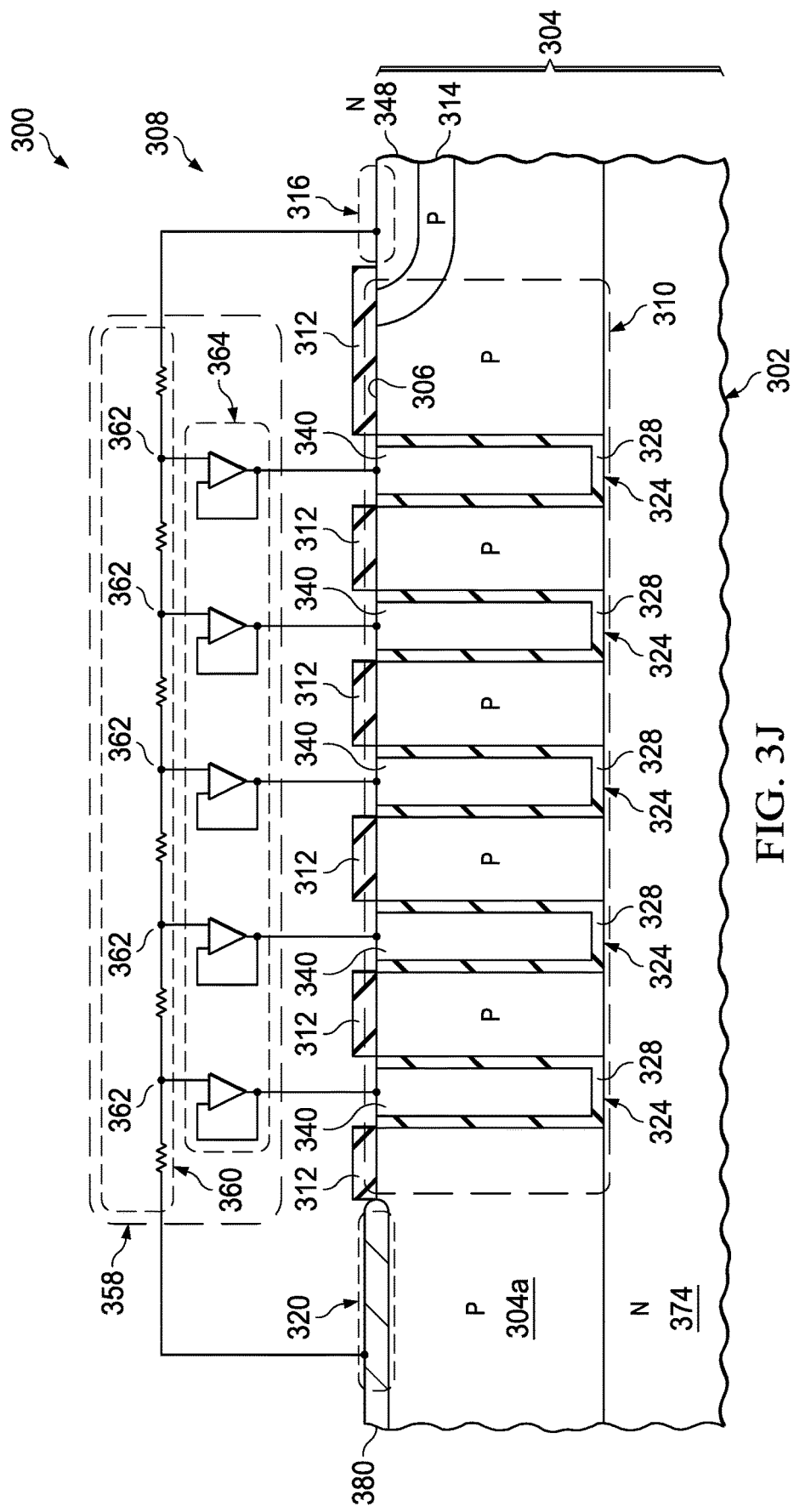

Referring to FIG. 3I and FIG. 3J, during operation of the microelectronic device 300, a first operational potential is provided to the first region 316. In this example, the first operational potential may be implemented as an anode bias applied to the anode contact region 348. Also during operation of the microelectronic device 300, a second operational potential is provided to the second region 320. In this example, the second operational potential may be implemented as a cathode bias applied to the cathode 380. When the Schottky diode 308 is in an off state, the first operational potential may be significantly lower, for example, 30 volts to 500 volts lower, than the second operational potential. When the Schottky diode 308 is in an on state, the first operational potential may be a few volts higher than the second operational potential.

Circuitry 358 is formed in the microelectronic device 300. The circuitry 358 is configured to apply bias potentials to each of the field plate segments 340. All the bias potentials are between the first operational potential and the second operational potential. The circuitry 358 may include an impedance ladder 360 with internal nodes 362 electrically coupled through buffers 364 to the field plate segments 340, as indicated schematically in FIG. 3I and FIG. 3J. The impedance ladder 360 may have impedances including resistors, capacitor, inductors, or diodes between the internal nodes 362. Each internal node 362 may be coupled to all the field plate segments 340 in a corresponding row 326, as indicated in FIG. 3I. End terminals of the impedance ladder 360 may be connected to the anode contact region 348 and the cathode 380.

The bias potentials are monotonic with respect to distances of the field plate segments 340 from the first region 316 of the doped region 310, as explained in reference to FIG. 1K and FIG. 1L. To illustrate the monotonic relationship with respect to this example, the field plate segments 340 include a first field plate segment 340a nearest the first region 316, a second field plate segment 340b nearest the second region 320, and a third field plate segment 340c between the first field plate segment 340a and the second field plate segment 340b. The circuitry 358 is configured to apply a first bias potential to the first field plate segment 340a, apply a second bias potential to the second field plate segment 340b, and apply a third bias potential to the third field plate segment 340c. The first bias potential, the second bias potential, and the third bias potential are all between the first operational potential and the second operational potential. The first bias potential is between the first operational potential and the third bias potential. The second bias potential is between the third bias potential and the second operational potential. The third bias potential is between the first bias potential and the second bias potential.

Having the circuitry 358 configured to provide the bias potentials in the monotonic relationship with respect to distances of the field plate segments 340 from the first region 316 may accrue the advantages disclosed in reference to the MOS transistor 108 of FIG. 1K and FIG. 1L. Having the trenches 324 arranged to be equidistant from neighboring trenches 324 may provide a more uniform electric field in the doped region 310 in the off state. The circuitry 358 is configured to adjust the bias potentials applied to the field plate segments 340 as the first operational potential or the second operational potential changes during operation of the Schottky diode 308 from the off state to the on state, and back to the off state, accruing the advantage of lower potential difference across the trench liners 328, and hence higher operating potential, as explained above.

FIG. 4A and FIG. 4B are charts depicting example monotonic relationships between bias potentials and distances from a first region of a doped region of an active component of a microelectronic device, as disclosed in the examples herein. The bias potentials are applied by circuitry of the microelectronic device. The first chart 400 of FIG. 4A illustrates a first case in which the first operational potential is higher than the second operational potential. The first case may be encountered during operation of the MOS transistor 108 or the IGBT 208, as disclosed herein. The vertical direction of the first chart 400 spans values of the bias potentials applied to field plate segments in the doped region, as disclosed in the examples herein. The bias potentials are between the first operational potential and the second operational potential.

The horizontal direction of the first chart 400 spans values of the distances of the field plate segments from the first region of the doped region. The distances are between zero and a length of the doped region. The length of the doped region is less than, or equal to, to a lateral distance between the first region and the second region.

Points 402 in the first chart 400 represent distances of the field plate segments from the first region and their corresponding bias potentials. The first chart 400 shows seven points 402; other semiconductor devices may have more or fewer separate distances. Moreover, the semiconductor devices may have multiple instances of the field plate segments at each distance; each of the field plate segments at the same distance may have the same applied bias.

The bias potentials applied to the field plate segments have a monotonic relationship to the corresponding distances, that is, in the first case depicted in the first chart 400, field plate segments nearer to the first region have higher bias potentials than field plate segments farther from the first region. The following relationships apply to any three field plate segments having different distances from the first region. A first point 402a represents a first field plate segment having a first distance from the first region, the first field plate segment having a first bias potential applied to it by the circuitry. A second point 402b represents a second field plate segment having a second distance from the first region that is greater than the first distance, the second field plate segment having a second bias potential applied to it by the circuitry. A third point 402c represents a third field plate segment having a third distance from the first region that is between the first distance and the second distance, the third field plate segment having a third bias potential applied to it by the circuitry. That is, the third distance is greater than the first distance and less than the second distance. In this first case, the first bias is higher than the second bias and the third bias, and the second bias is higher than the third bias. As the first operational potential or the second operational potential, or both, change during operation of the semiconductor device, the circuitry adjusts the bias potentials to maintain the monotonic relationship between the distances from the first region and the corresponding bias potentials.

The second chart 404 of FIG. 4B illustrates a second case in which the first operational potential is lower than the second operational potential. The second case may be encountered during operation of the Schottky diode 308 in an off state, as disclosed herein. The vertical direction of the second chart 404 spans values of the bias potentials, and the horizontal direction spans values of the distances. The bias potentials are between the first operational potential and the second operational potential. The distances are between zero and a length of the doped region. Points 406 in the second chart 404 represent distances of the field plate segments from the first region and their corresponding bias potentials.

The bias potentials applied to the field plate segments in this second case also have a monotonic relationship to the corresponding distances. In this second case, depicted in the second chart 404, field plate segments nearer to the first region have lower bias potentials than field plate segments farther from the first region. The following relationships apply to any three field plate segments having different distances from the first region. A first point 406a represents a first field plate segment having a first distance from the first region, the first field plate segment having a first bias potential applied to it by the circuitry. A second point 406b represents a second field plate segment having a second distance from the first region that is greater than the first distance, the second field plate segment having a second bias potential applied to it by the circuitry. A third point 406c represents a third field plate segment having a third distance from the first region that is between the first distance and the second distance, the third field plate segment having a third bias potential applied to it by the circuitry. That is, the third distance is greater than the first distance and less than the second distance. In this second case, the first bias is lower than the second bias and the third bias, and the second bias is lower than the third bias. As the first operational potential or the second operational potential, or both, change during operation of the semiconductor device, the circuitry adjusts the bias potentials to maintain the monotonic relationship between the distances from the first region and the corresponding bias potentials.

Various features of the examples disclosed herein may be combined in other manifestations of example microelectronic devices. For example, any of the doped regions 110, 210, or 310 may be n-type or p-type. Any of the active components 108, 208, or 308 may be implemented as MOS transistors, bipolar transistors, or diodes. Any of the circuitry 158, 258, or 358 may include a resistor ladder or an impedance ladder to provide the bias potentials at the internal nodes. Any of the circuitry 158, 258, or 358 may include buffers to couple the internal nodes to the field plate segments.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a microelectronic device, comprising:
   forming a doped region in a semiconductor substrate;
   forming trenches in the doped region;
   forming a dielectric liner in each of the trenches, each dielectric liner contacting the doped region;
   forming field plate segments in the trenches on the dielectric liners;
   forming a resistor ladder including internal nodes; and
   forming electrical couplings between the internal nodes of the resistor ladder and the field plate segments, wherein the resistor ladder is configured to apply bias potentials to the field plate segments.

2. The method of claim 1, wherein the bias potentials are in a monotonic relationship with respect to distances of the field plate segments from a first region of the doped region.

3. The method of claim 1, wherein forming the field plate segments includes forming polycrystalline silicon on the dielectric liner.

4. The method of claim 1, wherein forming the field plate segments includes forming metal on the dielectric liner.

5. The method of claim 1, wherein the dielectric liner is formed concurrently with a gate dielectric layer of a metal oxide semiconductor (MOS) transistor of the microelectronic device.

6. The method of claim 1, wherein the field plate segments are formed concurrently with a gate of an MOS transistor of the microelectronic device.

7. The method of claim 1, wherein forming the electrical couplings includes forming buffers coupled between the internal nodes and the field plate segments.

8. A method comprising:
forming a first region and a second region in a semiconductor substrate;
forming a doped region in the semiconductor substrate between the first region and the second region;
forming trenches extending into the doped region;
forming field plate segments in the trenches, each field plate segment separated from the semiconductor substrate by a dielectric liner, wherein the field plate segments include a first field plate segment proximate the first region, a second field plate segment proximate the second region, and a third field plate segment between the first and second field plate segments; and
forming a circuitry electrically connected to each of the field plate segments, wherein the circuitry includes a resistor ladder having internal nodes that are electrically coupled to the field plate segments, and wherein the internal nodes of the resistor ladder includes:
a first bias potential node of the circuitry coupled to the first field plate segment;
a second bias potential node of the circuitry coupled to the second field plate segment; and
a third bias potential node of the circuitry coupled to the third field plate segment, wherein the first bias potential node, second bias potential node, and the third bias potential node are distinct from each other.

9. The method of claim 8, wherein the resistor ladder is configured to apply a first bias potential to the first field plate segment, a second bias potential to the second field plate segment, and a third bias potential to the third field plate segment.

10. The method of claim 9, wherein the first, second, third bias potentials are monotonic with respect to distances of the field plate segments from the first region.

11. The method of claim 9, wherein:
the first region is configured to be at a first operational potential;
the second region is configured to be at a second operational potential; and
the first bias potential, the second bias potential, and the third bias potential are between the first operational potential and the second operational potential, the third bias potential being between the first bias potential and the second bias potential.

12. The method of claim 9, wherein:
the first field plate segment is one of first field plate segments in a first row proximate the first region;
the second field plate segment is one of second field plate segments in a second row proximate the second region; and
the third field plate segment is one of third field plate segments in a third row located between the first and second rows.

13. The method of claim 12, wherein the internal nodes of the resistor ladder includes:
the first bias potential node coupled to the first field plate segments in the first row;
the second bias potential node coupled to the second field plate segments in the second row; and
the third bias potential node coupled to the third field plate segments in the third row.

14. The method of claim 8, wherein the doped region is part of a metal oxide semiconductor (MOS) transistor.

15. The method of claim 8, wherein:
the first region is configured to be at a first operational potential; and
the second region is configured to be at a second operational potential different from the first operational potential.

16. The method of claim 8, wherein the first, second, and third bias potential nodes are electrically coupled to the first, second, and third field plate segments through buffers.

17. The method of claim 8, wherein the circuitry is configured to:
apply a first bias potential to the first field plate segment through the first bias potential node;
apply a second bias potential to the second field plate segment through the second bias potential node; and
apply a third bias potential to the third field plate segment through the third bias potential node.

18. The method of claim 17, wherein the first, second, and third bias potentials are monotonic with respect to distances of the first, second, and third field plate segments from the first region.

19. The method of claim 17, wherein:
the first region is configured to be at a first operational potential;
the second region is configured to be at a second operational potential different from the first operational potential; and
the first bias potential, the second bias potential, and the third bias potential are between the first operational potential and the second operational potential, the third bias potential being between the first bias potential and the second bias potential.

* * * * *